(12) United States Patent
Kim

(10) Patent No.: US 12,118,241 B2
(45) Date of Patent: Oct. 15, 2024

(54) MEMORY CONTROLLER, MEMORY SYSTEM, AND OPERATING METHOD THEREOF

(71) Applicant: SK hynix Inc., Icheon (KR)

(72) Inventor: Do Hun Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/233,210

(22) Filed: Apr. 16, 2021

(65) Prior Publication Data

US 2021/0232343 A1 Jul. 29, 2021

Related U.S. Application Data

(63) Continuation-in-part of application No. 16/871,775, filed on May 11, 2020, now Pat. No. 11,194,520, and (Continued)

(30) Foreign Application Priority Data

| Oct. 27, 2017 | (KR) | 10-2017-0141380 |
| Jan. 2, 2018 | (KR) | 10-2018-0000363 |
| Feb. 27, 2019 | (KR) | 10-2019-0023135 |

(51) Int. Cl.
| G06F 3/06 | (2006.01) |
| G06F 11/10 | (2006.01) |
| G06F 12/10 | (2016.01) |
| G11C 29/04 | (2006.01) |
| G11C 29/52 | (2006.01) |

(52) U.S. Cl.
CPC .......... *G06F 3/0659* (2013.01); *G06F 3/0604* (2013.01); *G06F 3/068* (2013.01); *G06F 11/1048* (2013.01); *G06F 11/1068* (2013.01); *G06F 12/10* (2013.01); *G06F 2212/1008* (2013.01); *G06F 2212/608* (2013.01); (Continued)

(58) Field of Classification Search
None
See application file for complete search history.

(56) References Cited

U.S. PATENT DOCUMENTS

| 5,509,132 A | 4/1996 | Matsuda et al. |
| 5,604,753 A | 2/1997 | Bauer et al. |

(Continued)

FOREIGN PATENT DOCUMENTS

| CN | 103026346 A | 4/2013 |
| CN | 105159844 A | 12/2015 |

(Continued)

OTHER PUBLICATIONS

Office Action dated Mar. 5, 2020 for U.S. Appl. No. 16/111,044.

(Continued)

*Primary Examiner* — Elias Mamo

(57) ABSTRACT

A memory controller includes a cache memory, a host control circuit, and a flash translation layer. The host control circuit receives a read command and a logical address from a host, reads out mapping information corresponding to the logical address from a buffer memory device, and caches the mapping information in the cache memory. The flash translation layer reads a physical address corresponding to the logical address from the mapping information cached in the cache memory.

16 Claims, 13 Drawing Sheets

Related U.S. Application Data a continuation-in-part of application No. 16/781,309, filed on Feb. 4, 2020, now Pat. No. 11,366,763, and a continuation-in-part of application No. 16/111,044, filed on Aug. 23, 2018, now Pat. No. 11,068,408, said application No. 16/871,775 is a continuation of application No. 15/976,651, filed on May 10, 2018, now Pat. No. 10,684,796.

(52) U.S. Cl.
CPC .......... *G06F 2212/657* (2013.01); *G11C 2029/0411* (2013.01); *G11C 29/52* (2013.01)

(56) References Cited

U.S. PATENT DOCUMENTS

| | | | |
|---|---|---|---|
| 5,841,598 A * | 11/1998 | Horiuchi | G06F 12/0804 |
| | | | 711/E12.04 |
| 5,862,083 A | 1/1999 | Tobita et al. | |
| 6,078,520 A | 6/2000 | Tobita et al. | |
| 6,222,786 B1 | 4/2001 | Holland et al. | |
| 6,725,333 B1 | 4/2004 | Degenaro et al. | |
| 8,046,551 B1 | 10/2011 | Sahin | |
| 8,732,388 B2 * | 5/2014 | Chen | G06F 12/1009 |
| | | | 711/206 |
| 8,909,860 B2 | 12/2014 | Rao | |
| 8,930,647 B1 | 1/2015 | Smith | |
| 2002/0188815 A1 | 12/2002 | Wang et al. | |
| 2008/0244153 A1 | 10/2008 | Huang | |
| 2010/0287327 A1 | 11/2010 | Li et al. | |
| 2011/0022779 A1 | 1/2011 | Lund et al. | |
| 2011/0047437 A1 | 2/2011 | Flynn | |
| 2011/0072196 A1 | 3/2011 | Forhan et al. | |
| 2011/0179200 A1 | 7/2011 | Sukonik et al. | |
| 2012/0072702 A1 | 3/2012 | Pierson et al. | |
| 2012/0144448 A1 | 6/2012 | Gunawardena et al. | |
| 2012/0311262 A1 | 12/2012 | Franceschini et al. | |
| 2013/0103917 A1 | 4/2013 | Gupta | |
| 2013/0124794 A1 | 5/2013 | Bux et al. | |
| 2013/0205097 A1 | 8/2013 | Flynn et al. | |
| 2013/0318285 A1 | 11/2013 | Pignatelli | |
| 2014/0059275 A1 | 2/2014 | Yun et al. | |
| 2014/0281806 A1 | 9/2014 | Sharon et al. | |
| 2014/0297603 A1 | 10/2014 | Kim et al. | |
| 2015/0010143 A1 | 1/2015 | Yang | |
| 2015/0117107 A1 | 4/2015 | Sun et al. | |
| 2015/0149742 A1 | 5/2015 | Richter et al. | |
| 2015/0347314 A1 * | 12/2015 | Lee | G06F 12/1009 |
| | | | 711/103 |
| 2015/0356019 A1 | 12/2015 | Johar et al. | |
| 2015/0370734 A1 | 12/2015 | Mangano et al. | |
| 2016/0006461 A1 | 1/2016 | Yin et al. | |
| 2016/0154594 A1 * | 6/2016 | Kang | G06F 12/0246 |
| | | | 711/103 |
| 2016/0162416 A1 | 6/2016 | Boyd et al. | |
| 2016/0179697 A1 * | 6/2016 | Park | G06F 12/0246 |
| | | | 711/206 |
| 2016/0274820 A1 | 9/2016 | Suzuki | |
| 2016/0299710 A1 | 10/2016 | Chang | |
| 2016/0321010 A1 * | 11/2016 | Hashimoto | G06F 3/0659 |
| 2016/0328161 A1 | 11/2016 | Huang et al. | |
| 2017/0031615 A1 | 2/2017 | Lee | |
| 2017/0031626 A1 | 2/2017 | Kim et al. | |
| 2017/0075596 A1 * | 3/2017 | Iwai | G11C 16/3459 |
| 2017/0102884 A1 * | 4/2017 | Kim | G06F 3/0659 |
| 2017/0131925 A1 | 5/2017 | Kim et al. | |
| 2017/0131951 A1 | 5/2017 | Miura | |
| 2017/0228155 A1 | 8/2017 | Shirota et al. | |
| 2017/0242752 A1 | 8/2017 | Lee | |
| 2018/0004698 A1 | 1/2018 | Brouwer et al. | |
| 2018/0006963 A1 | 1/2018 | Brouwer et al. | |
| 2018/0130537 A1 | 5/2018 | Kim et al. | |
| 2018/0253353 A1 | 9/2018 | Takase | |
| 2018/0275898 A1 | 9/2018 | Bhansali et al. | |
| 2018/0374550 A1 | 12/2018 | Barndt et al. | |
| 2019/0065072 A1 | 2/2019 | Dirik et al. | |
| 2019/0073129 A1 | 3/2019 | Anderson et al. | |
| 2019/0073142 A1 | 3/2019 | Ash et al. | |
| 2019/0073317 A1 | 3/2019 | Anderson et al. | |
| 2019/0087345 A1 | 3/2019 | Hijaz et al. | |
| 2019/0129654 A1 | 5/2019 | Kim | |
| 2019/0129971 A1 | 5/2019 | Hironaka et al. | |
| 2019/0205257 A1 | 7/2019 | Kim | |
| 2019/0258572 A1 | 8/2019 | Rowlands et al. | |
| 2019/0377679 A1 | 12/2019 | Murphy et al. | |
| 2020/0272362 A1 | 8/2020 | Kim | |

FOREIGN PATENT DOCUMENTS

| | | |
|---|---|---|
| CN | 107015920 A | 8/2017 |
| CN | 108694684 A | 10/2018 |
| CN | 109074228 A | 12/2018 |
| KR | 100293276 B1 | 9/2001 |
| KR | 10-0858527 B1 | 9/2008 |
| KR | 101014040 B1 | 2/2011 |
| KR | 20150138713 A | 12/2015 |
| KR | 1020160035737 A | 4/2016 |
| KR | 101711945 B1 | 3/2017 |
| KR | 20170070920 A | 6/2017 |
| KR | 101790165 B1 | 11/2017 |
| KR | 101858159 B | 6/2018 |
| KR | 20180104830 A | 9/2018 |
| KR | 20190054974 A | 5/2019 |
| KR | 101992934 B1 | 6/2019 |
| KR | 20190067088 A | 6/2019 |
| KR | 102002925 B1 | 7/2019 |
| KR | 20190082584 A | 7/2019 |
| KR | 20200095103 A | 8/2020 |

OTHER PUBLICATIONS

Office Action dated Oct. 7, 2020 for U.S. Appl. No. 16/111,044.
Notice of Allowance dated Apr. 8, 2022 for U.S. Appl. No. 16/781,309.
Final Office Action dated Oct. 22, 2021 issued in related U.S. Appl. No. 16/781,309.
Notice of Allowance dated May 12, 2020 issued in related U.S. Appl. No. 15/976,651.
Office Action dated Sep. 13, 2019 issued in related U.S. Appl. No. 15/976,651.
Office Action dated Mar. 30, 2021 issued in related U.S. Appl. No. 16/781,309.
Notification of the First Office Action dated Sep. 3, 2021 for related CN Patent Application No. 201810554611.9.
Notice of Allowance dated Aug. 6, 2021 for related U.S. Appl. No. 16/871,775.
Notification of the First Office Action dated Aug. 25, 2022 for Chinese Application No. 201811082229.9. .
Ren-Shuo Liu et al., "Improving Read Performance of NAND Flash SSDs by Exploiting Error Locality," IEEE Transactions on Computers, Apr. 2014, vol. 65, No. 4, pp. 1090-1102.

* cited by examiner

MEMORY CONTROLLER, MEMORY SYSTEM, AND OPERATING METHOD THEREOF

CROSS-REFERENCE TO RELATED APPLICATION

The present application is a continuation-in-part of U.S. patent application Ser. No. 16/871,775, filed on May 11, 2020, which is a continuation application of U.S. patent application Ser. No. 15/976,651, filed on May 10, 2018 and now issued as U.S. Pat. No. 10,684,796 which claims benefits of priority of Korean Patent Application No. 10-2017-0141380, filed on Oct. 27, 2017, U.S. patent application Ser. No. 16/111,044, filed on Aug. 23, 2018 which claims benefits of priority of Korean Patent Application No. 10-2018-0000363, filed on Jan. 2, 2018, and U.S. patent application Ser. No. 16/781,309, filed on Feb. 4, 2020 which claims benefits of priority of Korean Patent Application No. 10-2019-0023135, filed on Feb. 27, 2019, which are incorporated herein by reference in their entirety.

BACKGROUND

Various embodiments of the present disclosure relate to a memory controller, a memory system, and an operating method thereof, capable of reading data stored in a buffer memory device at a high speed using a cache memory.

DESCRIPTION OF RELATED ART

A nonvolatile memory device may include a plurality of memory blocks. Each of the memory blocks may include a plurality of memory cells. An erase operation for the nonvolatile memory device may be simultaneously performed on a plurality of memory cells included in a single memory block. That is, the erase operation of the nonvolatile memory device may be performed on a memory block basis.

When a memory system including a nonvolatile memory device receives a write command and a logical address from a host, the memory system may assign a physical address corresponding to the logical address and write data in a storage area of the nonvolatile memory device that corresponds to the physical address.

The memory system may store logical-physical address mapping information in a buffer memory device, the physical-logical address mapping information representing a mapping relationship between the logical address and the physical address. After that, when the memory system receives a read command from the host, the memory system may read the data stored in the nonvolatile memory device using the logical-physical address mapping information stored in the buffer memory device, and output the read data to the host.

SUMMARY

Various embodiments of the present disclosure are directed to a memory system capable of reading data stored in a buffer memory device at a high speed using a cache memory, and an operating method thereof. According to an embodiment, a memory controller may include a cache memory, a host control circuit configured to receive a read command and a logical address from a host, read out mapping information corresponding to the logical address from a buffer memory device, and cache the mapping information in the cache memory, and a flash translation layer configured to read a physical address corresponding to the logical address from the mapping information cached in the cache memory.

According to another embodiment, a method of operating a memory system may include receiving a read command and a logical address from a host, reading mapping information corresponding to the read command from a buffer memory device and caching the mapping information in a cache memory, by a host control circuit, and reading, by a flash translation layer, a physical address corresponding to the logical address from the mapping information cached in the cache memory.

According to another embodiment, a memory system may include a nonvolatile memory device, a buffer memory device configured to store logical-physical address mapping information, and a memory controller configured to control operations of the nonvolatile memory device and the buffer memory device. The memory controller may include a cache memory, a host control circuit configured to receive a read command and a logical address from a host, read out mapping information corresponding to the logical address from the buffer memory device, and cache the mapping information in the cache memory, and a flash translation layer configured to read a physical address corresponding to the logical address from the mapping information cached in the cache memory.

DETAILED DESCRIPTION

Example embodiments will now be described more fully hereinafter with reference to the accompanying drawings.

However, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

Embodiments relate to caching meta data, e.g., mapping information, stored in a buffer memory device using a cache memory and reading the cached meta data in order to improve read performance of a memory system.

In an embodiment, a host control circuit caches meta data in the cache memory and a flash translation layer (FTL) reads the cached meta data.

In another embodiment, a memory system outputs the meta data to be read directly from the cache memory when meta data to be read exists among meta data that has been cached in the cache memory in response to an earlier write request. In yet another embodiment, a cache memory caches the meta data only when meta data received from a buffer memory module has locality.

Figure 1:
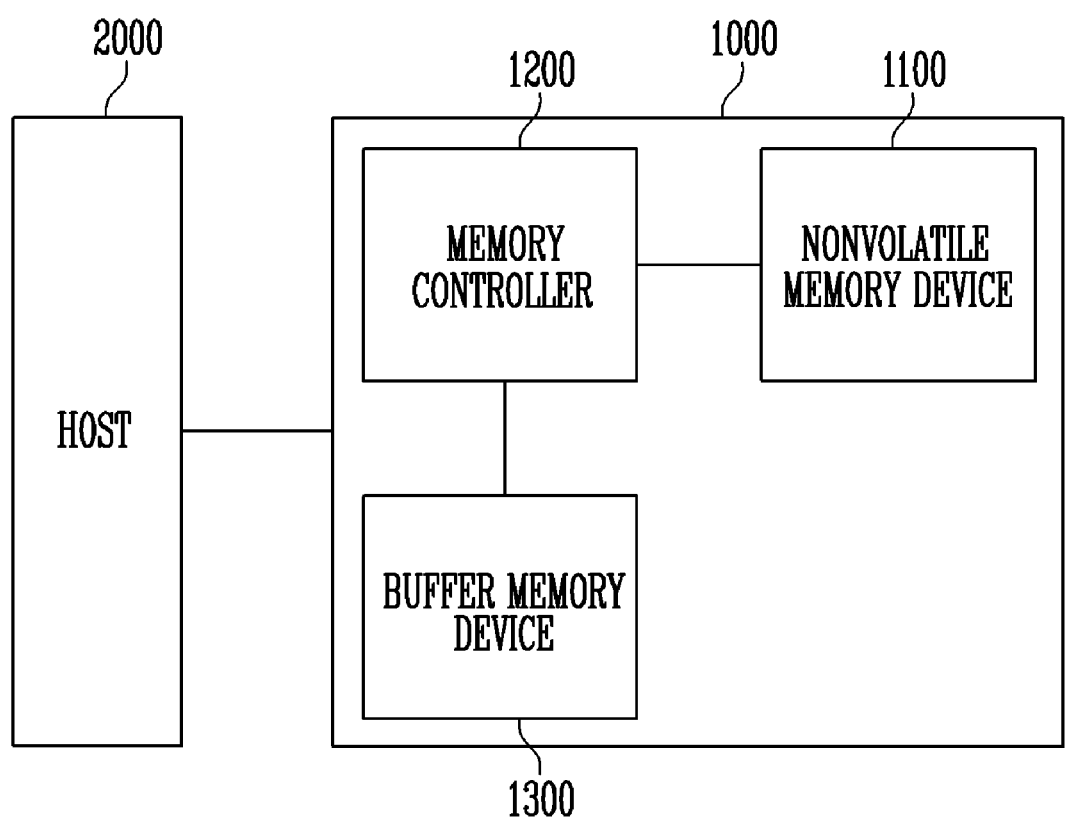
FIG. 1 is a diagram illustrating a memory system according to an embodiment.

FIG. 1 is a diagram illustrating a memory system 1000 according to an embodiment.

Referring to FIG. 1, the memory system 1000 may include a nonvolatile memory device 1100, a buffer memory device 1300, and a memory controller 1200. The nonvolatile memory device 1100 does not lose stored data even when power is shut off or interrupted. The buffer memory device 1300 temporarily stores data. The memory controller 1200 controls the nonvolatile memory device 1100 and the buffer memory device 1300 based on commands from a host 2000.

The host 2000 may communicate with the memory system 1000 using at least one of various communication methods such as Universal Serial Bus (USB), Serial Advanced Technology AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory controller 1200 may control general operations of the memory system 1000, and may control a data exchange between the host 2000 and the nonvolatile memory device 1100. For example, the memory controller 1200 may control the nonvolatile memory device 1100 to program or read data in response to a command from the host 2000. In addition, the memory controller 1200 may store information about main memory blocks and sub-memory blocks included in the nonvolatile memory device 1100, and may control the nonvolatile memory device 1100 to perform a program operation on a main memory block or a sub-memory block according to an amount of data to be loaded in the program operation. According to an embodiment, the nonvolatile memory device 1100 may include a flash memory. The memory controller 1200 may also control a data exchange between the host 2000 and the buffer memory device 1300, and temporarily store system data for controlling the nonvolatile memory device 1100 in the buffer memory device 1300. The buffer memory device 1300 may serve as an operation memory, a cache memory, or a buffer memory of the memory controller 1200. The buffer memory device 1300 may store codes and commands executed by the memory controller 1200. In addition, the buffer memory device 1300 may store data that is processed by the memory controller 1200.

The memory controller 1200 may temporarily store data provided by the host 2000 in the buffer memory device 1300, and may transmit the data temporarily stored in the buffer memory device 1300 to the nonvolatile memory device 1100, so that the nonvolatile memory device 1100 stores the transmitted data. The memory controller 1200 may also receive a logical address together with the data from the host 2000 and convert the logical address into a physical address that indicates a storage area of the nonvolatile memory device 1100 where the data is to be stored. In addition, the memory controller 1200 may store logical-physical address mapping information configuring a mapping relationship between the logical address and the physical address in the buffer memory device 1300.

According to an embodiment, the buffer memory device 1300 may include a Double Data Rate Synchronous Dynamic Random Access Memory (DDR SDRAM), a DDR4 SDRAM, Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), or the like.

According to another embodiment, the memory system 1000 may not include the buffer memory device 1300.

In an embodiment, the memory system 1000 may include a solid-state drive, a memory card, or the like.

Figure 2:
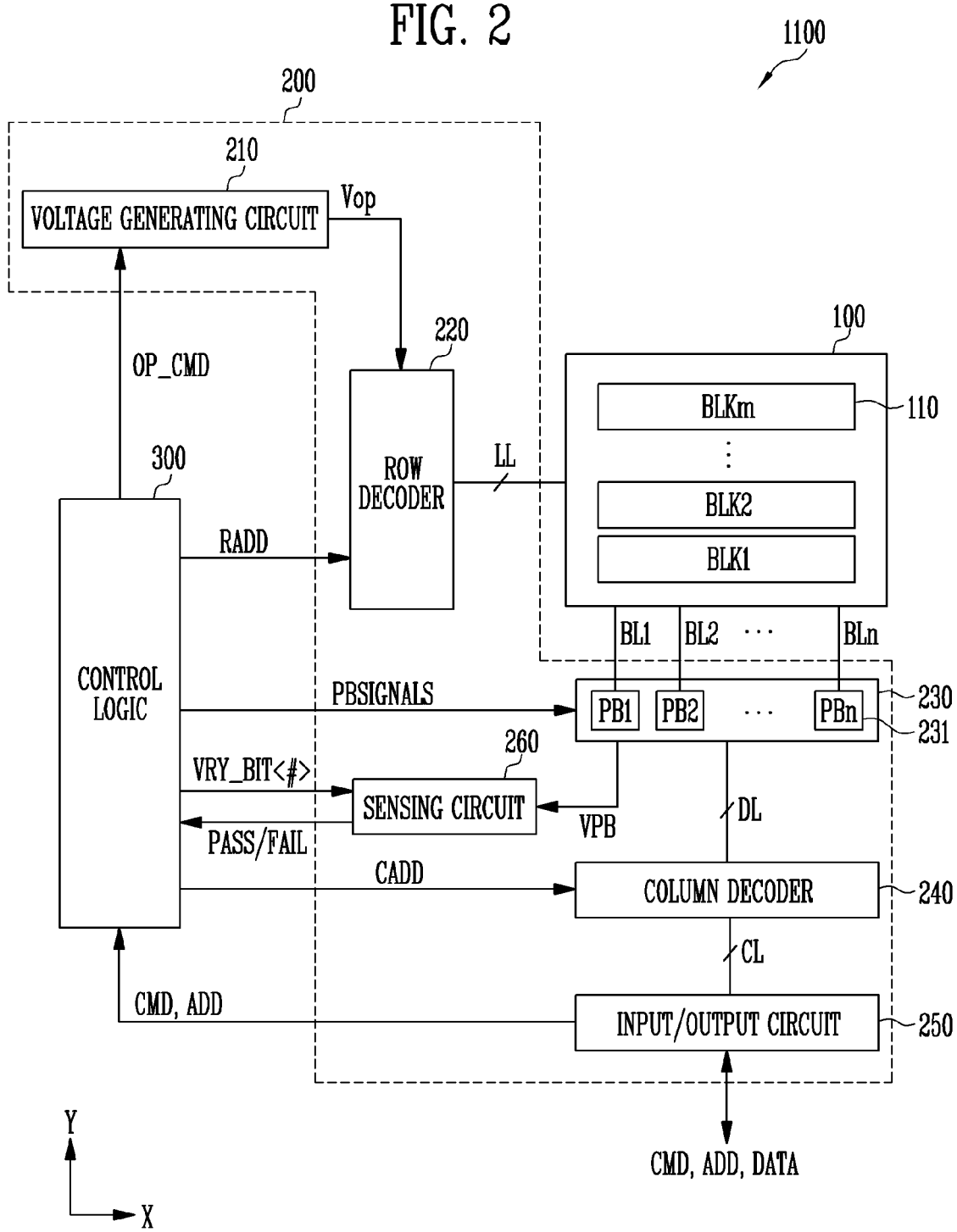
FIG. 2 is a diagram illustrating a nonvolatile memory device according to an embodiment.

FIG. 2 is a diagram illustrating the nonvolatile memory device 1100 shown in FIG. 1 according to an embodiment.

Referring to FIG. 2, the nonvolatile memory device 1100 may include a memory cell array 100 that stores data therein. The nonvolatile memory device 1100 may further include peripheral circuits 200 configured to perform a program operation for storing data in the memory cell array 100, a read operation for outputting the stored data, and an erase operation for erasing the stored data. The nonvolatile memory device 1100 may further include a control logic 300 that controls the peripheral circuits 200 in response to commands from the memory controller 1200 shown in FIG. 1.

The memory cell array 100 may include a plurality of memory blocks 110, e.g., BLK1 to BLKm, where m is a positive integer. Local lines LL and bit lines BL1 to BLn may be coupled to each of the memory blocks BLK1 to BLKm, where n is a positive integer.

For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line, and the second select line may be a drain select line. The local lines LL may further include source lines. The local lines LL may further include pipe lines.

The local lines LL may be coupled to each of the memory blocks BLK1 to BLKm, and each of the bit lines BL1 to BLn may be coupled in common to the memory blocks BLK1 to BLKm. Each of the memory blocks BLK1 to BLKm may have a two-dimensional (2D) or three-dimensional (3D) structure. For example, in a 2D memory block 110, memory cells may be arranged on a plane that is in parallel with a top surface of a substrate. For example, in a 3D memory block 110, memory cells may be stacked in a vertical direction perpendicular to the top surface of the substrate.

The peripheral circuits 200 may perform program, read, and erase operations on a selected memory block 110 in response to control signals provided by the control logic 300. For example, the control logic 300 may control the peripheral circuits 200, such that the peripheral circuits 200 supply a verify voltage and pass voltages to the local lines LL such as the first select line, the second select line, and the word lines, selectively discharge the first select line, the second select line, and the word lines, and verify memory cells coupled to a selected word line among the word lines. In the embodiment shown in FIG. 2, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop, which are used to perform program, read, and erase operations on the memory cell array 100, 5 in response to an operation control signal OP_CMD from the control logic 300. In addition, the voltage generating circuit 210 may selectively discharge the local lines LL in response to the operation control signal OP_CMD. For example, the operating voltages Vop include a program voltage, a verify voltage, pass voltages, a turn-on voltage, a read voltage, an erase voltage, a source line voltage, and so on.

The row decoder 220 may transfer the operating voltages Vop to the local lines LL coupled to the selected memory block 110 based on a row address RADD.

The page buffer group 230 may include a plurality of page buffers 231, e.g., PB1 to PBn respectively coupled to the bit lines BL1 to BLn. The page buffers PB1 to PBn may operate in response to page buffer control signals PBSIGNALS. For example, the page buffers PB1 to PBn may temporarily store data provided through the bit lines BL1 to BLn, or sense voltages or currents in the bit lines BL1 to BLn, during a read or verify operation.

The column decoder 240 may transfer data between the input/output circuit 250 and the page buffer group 230 based on a column address CADD. For example, the column decoder 240 may exchange data with the page buffers 231 through data lines DL, or may exchange data with the input/output circuit 250 through column lines CL.

The input/output circuit 250 may transfer a command CMD and an address ADD from the memory controller 1200 shown in FIG. 1 to the control logic 300, or may exchange data DATA with the column decoder 240. For example, the data DATA such as read data or write data is exchanged, through the input/output circuit 250, between the nonvolatile memory device 1100 and an external device such as the memory controller 1200.

The sensing circuit 260 may generate a reference current in response to an allowable bit VRY_BIT<#> and compare a sensing voltage VPB from the page buffer group 230 with a reference voltage generated from the reference current to thereby output a pass signal PASS or a fail signal FAIL during a read operation or a verify operation. The sensing voltage VPB is determined by sensing a voltage on a bit line coupled to a selected memory cell.

The control logic 300 may output the operation control signal OP_CMD, the row address RADD, the column address CADD, the page buffer control signals PBSIG-NALS, and the allowable bit VRY_BIT<#> based on the command CMD and the address ADD provided from the memory controller 1200 to thereby control the peripheral circuits 200. In addition, the control logic 300 may determine whether a verify operation performed on the selected memory cell is successful or unsuccessful based on the pass or fail signal PASS or FAIL.

In an operation of the nonvolatile memory device 1100, an erase operation may be performed on a memory block basis. In other words, data stored in a plurality of memory cells included in a single memory block 110 may be simultaneously erased, but may not be selectively erased.

Figure 3:
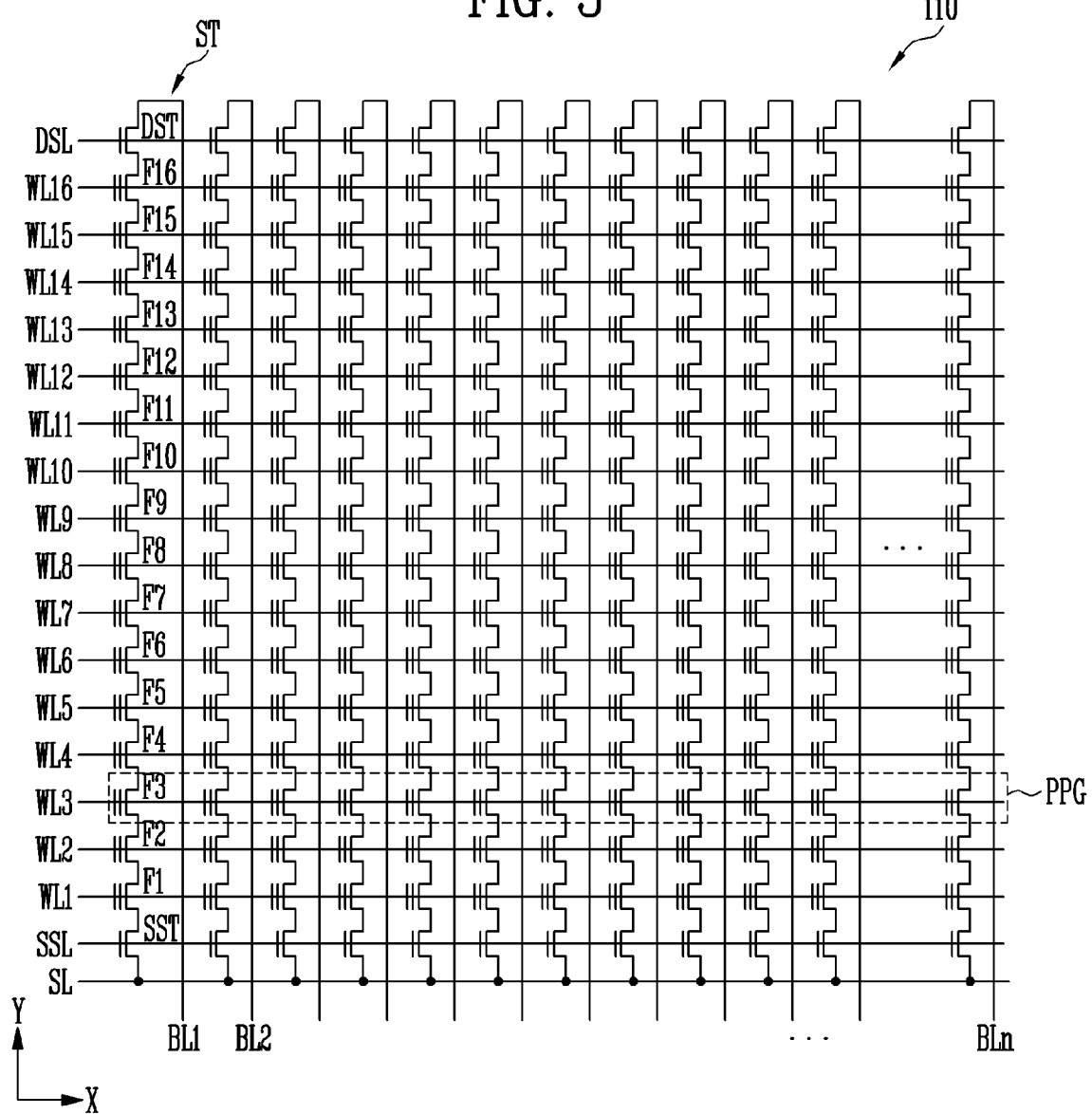
FIG. 3 is a diagram illustrating a memory block according to an embodiment.

FIG. 3 is a diagram illustrating the memory block 110 shown in FIG. 2 according to an embodiment.

Referring to FIG. 3, the memory block 110 may be coupled to a plurality of word lines, a first select line, and a second select line. The plurality of word lines may be arranged in parallel to each other and disposed between the first select line and the second select line. The first select line may be a source select line SSL, and the second select line may be a drain select line DSL. More specifically, the memory block 110 may include a plurality of strings ST that are coupled between the bit lines BL1 to BLn and a source line SL. Each of the bit lines BL1 to BLn may be coupled to a corresponding one of the strings ST, and the source line SL may be commonly coupled to the strings ST. Since the strings ST may have the same configuration, the first string ST coupled to the first bit line BL1 will be described in detail as an example.

In the embodiment shown in FIG. 3, the first string ST includes a source select transistor SST, a plurality of memory cells F1 to F16, and a drain select transistor DST that are coupled in series between the source line SL and the first bit line BL1. In other embodiments, a single string ST may include two or more source select transistors SST and two or more drain select transistors DST, and may include more memory cells than the memory cells F1 to F16 shown in FIG. 3.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in the plurality of strings ST may be coupled to the source select line SSL, and gates of the drain select transistors DST included in the plurality of strings ST may be coupled to the drain select line DSL. Gates of the memory cells F1 to F16 in the first string ST may be coupled to a plurality of word lines WL1 to WL16, respectively. Similar to the memory cells F1 to F16 in the first string ST, a plurality of memory cells included in another string ST in the memory block 110 may be coupled to the plurality of word lines WL1 to WL16, respectively. A group of memory cells coupled to the same word line, among the memory cells included in the plurality of strings ST, may be referred to as a physical page PPG. Therefore, the memory block 110 shown in FIG. 3 may include as many physical pages PPG as the word lines WL1 to WL16.

A single memory cell may store one bit of data. Such a memory cell is generally called a "single-level cell (SLC)." A single physical page PPG may store data corresponding to a single logical page LPG. Data corresponding to the single logical page LPG may include as many data bits as memory cells included in the single physical page PPG. Further, a single memory cell may store two or more bits of data. Such a memory cell is typically referred to as a "multi-level cell (MLC)." When the single memory cell may store two or more bits of data, the single physical page PPG may store data corresponding to two or more logical pages LPG.

When a memory cell stores 2-bit data, a single physical page PPG may include two pages PG. Each page PG may correspond to a single logical page LPG and store data of the single logical page LPG. A single memory cell storing two or more bits of data may include one of a plurality of threshold voltages depending on data stored therein, and thus a plurality of pages PG included in a single physical page PPG may be distinguished from each other by differences in their threshold voltages.

A plurality of memory cells included in a single physical page PPG may be simultaneously programmed. In other words, the nonvolatile memory device 1100 may perform a program operation on a physical page basis. A plurality of memory cells included in a single memory block may be simultaneously erased. In other words, the nonvolatile memory device 1100 may perform an erase operation on a memory block basis.

In an embodiment, in order to update a portion of data stored in a first memory block, the entire data stored in the first memory block may be read, and the portion of the data may be changed. After that, the entire data including the updated portion may be programmed in a second memory block. That is, when an erase operation is performed on a memory block basis in the memory device 1100, since it may be impossible to erase only a portion of data stored in a first memory block and then to program the first memory block with new data, the entire data including an updated portion is stored in a second memory block.

Figure 4:
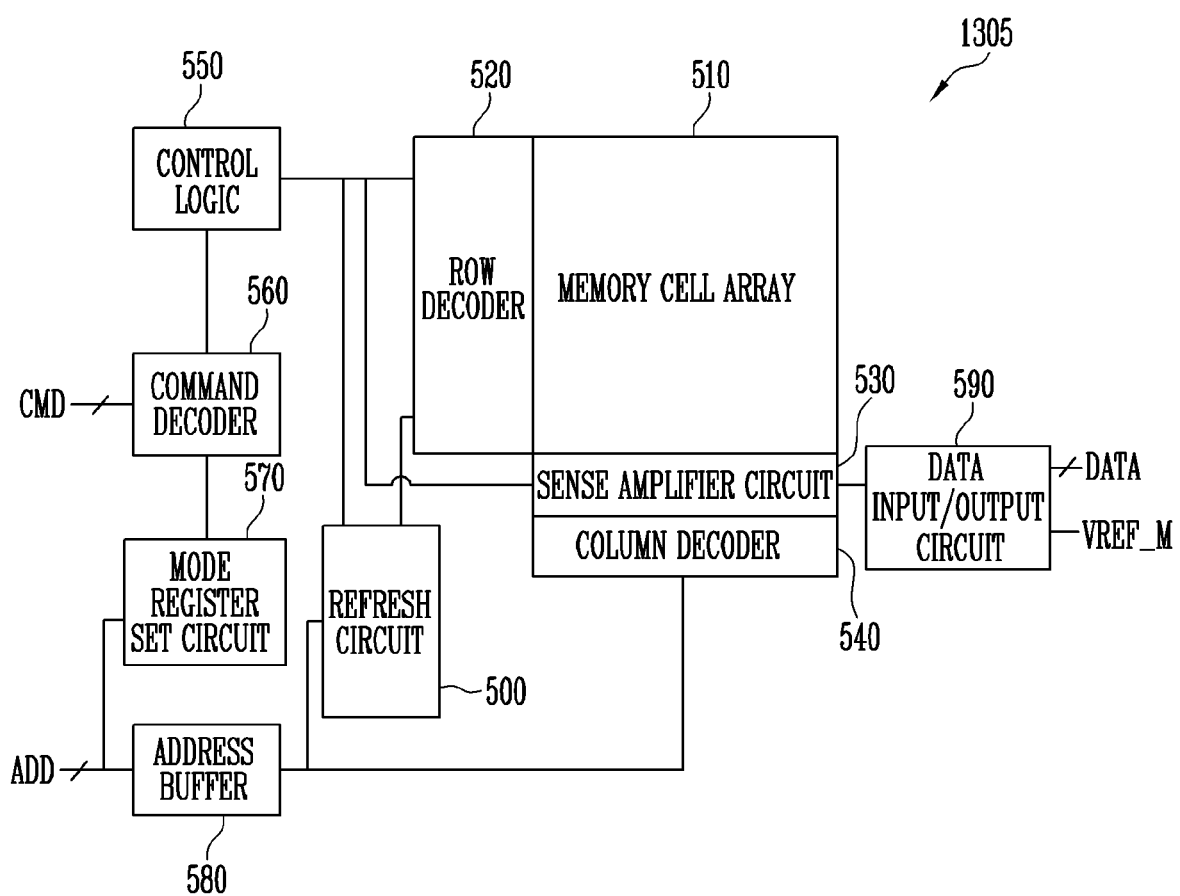
FIG. 4 is a diagram illustrating a buffer memory device according to an embodiment.

FIG. 4 is a diagram illustrating the buffer memory device 1300 shown in FIG. 1 according to an embodiment.

Referring to FIG. 4, the buffer memory device 1300 may include at least one DRAM 1305. The DRAM 1305 may include a memory cell array 510, a row decoder 520, a sense amplifier circuit 530, a column decoder 540, a control logic 550, a command decoder 560, a mode register set circuit 570, an address buffer 580, a data input/output circuit 590, and a refresh circuit 500.

The memory cell array 510 is a data storage space where a plurality of memory cells may be arranged in row and column directions. The memory cell array 510 may include a plurality of DRAM memory cells, and data stored in the DRAM memory cells may be lost when power is off. The sense amplifier circuit 530 may detect and amplify a difference in voltage of a bit line pair that occurs by distribution of an electric charge stored in a selected memory cell to thereby read data stored in the selected memory cell of the memory cell array 510.

Write data DATA input through the data input/output circuit 590 may be written into the memory cell array 510 based on an address signal ADD, or read data DATA read from the memory cell array 510 based on the address signal ADD may be output through the data input/output circuit 590 to an external device. The address signal ADD may be input to the address buffer 580 in order to designate the selected memory cell to which the write data DATA is written or from which the read data DATA is read. The address buffer 580 may temporarily store the address signal ADD that is provided from an external device.

The data input/output circuit 590 may also receive a reference voltage VREF_M from an external device. Whether the write data DATA has a logic high or low level when the write data DATA is input to the DRAM 1305 may be determined based on the reference voltage VREF_M.

The row decoder 520 may decode a row address in the address signal ADD that is transferred from the address buffer 580 so as to designate a selected word line which is coupled to the selected memory cell. In other words, in a data write mode or a data read mode, the row decoder 520 may decode the row address transferred from the address buffer 580 to enable the selected word line.

The column decoder 540 may decode a column address in the address signal ADD that is transferred from the address buffer 580 so as to designate a selected bit line which is coupled to the selected memory cell.

The command decoder 560 may receive an externally applied command signal CMD, and may decode the command signal CMD to generate an internal command signal. The mode register set circuit 570 may set an internal mode register in response to a mode register set (MRS) command and the address signal ADD, thereby designating an operation mode of the DRAM 1305. The control logic 550 may control operations of the DRAM 1305 in response to the internal command signal output from the command decoder 560.

The refresh circuit 500 may control a refresh operation of the DRAM 1305. In the refresh operation, data stored in the memory cell array 510 is read out and then written again to the memory cell array 510 in order to prevent an electric charge, which is accumulated in a capacitor of each DRAM memory cell included in the memory cell array 510, from being lost.

Although it is not illustrated in FIG. 4, the DRAM 1305 may further include a clock circuit to generate a clock signal and a power circuit to generate an internal voltage to be used by the DRAM 1305 based on an externally applied power voltage.

Figure 5:
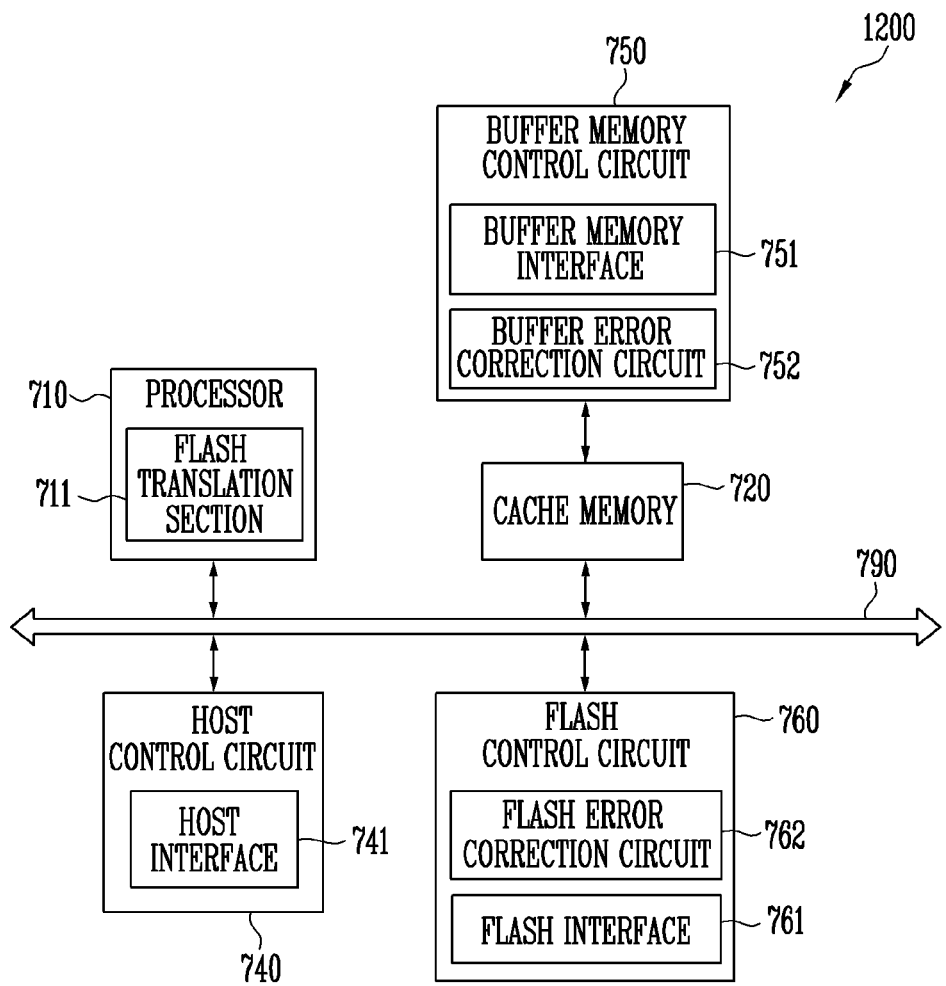
FIG. 5 is a diagram illustrating a memory controller according to an embodiment.

FIG. 5 is a diagram illustrating the memory controller 1200 of FIG. 1 according to an embodiment.

Referring to FIG. 5, the memory controller 1200 may include a processor 710, a cache memory 720, a host control circuit 740, a buffer memory control circuit 750, a flash control circuit 760, and a bus 790. The processor 710 may include a flash translation section (or flash translation layer (FTL)) 711, and the host control circuit 740 may include a host interface 741. The flash control circuit 760 may include a flash interface 761 and a flash error correction circuit 762. The buffer memory control circuit 750 may include a buffer memory interface 751 and a buffer error correction circuit 752.

The bus 790 may provide channels between components of the memory controller 1200.

For example, the bus 790 of the memory controller 1200 may be divided into a control bus and a data bus. The data bus may transmit data in the memory controller 1200, and the control bus may transmit control information such as commands or addresses in the memory controller 1200. The data bus and the control bus may be isolated from each other, and may neither interfere with nor influence each other. In an embodiment, the data bus is dedicated to data transmission only and the control bus is dedicated to control information transmission only. The bus 790 may be coupled to the processor 710, the cache memory 720, the host control circuit 740, and the flash control circuit 760. In another example, a data bus and a control bus may share a bus line, and data and control information may be transmitted through the bus line.

The host interface 741 in the host control circuit 740 may communicate with the external host 2000 shown in FIG. 1. The host interface 741 may perform communications using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The host control circuit 740 may be coupled between the external host 2000 and the bus 790, and may communicate with the flash translation section 711 of the processor 710 and the cache memory 720 through the bus 790. The host control circuit 740 may receive, through the host interface 741, a command, a logical address, and data from the host 2000. The host control circuit 740 may transfer the logical address to the flash translation section 711 through the bus 790, and may transfer the data to the cache memory 720 or to the buffer memory device 1300 shown in FIG. 1 through the bus 790. The data may be transferred to the buffer memory device 1300 via the cache memory 720 or another data connection path (not shown) to the buffer memory device 1300 from the bus 790.

The processor 710 may control the overall operations of the memory controller 1200, and may perform a logical operation. The processor 710 may queue a plurality of commands provided from the host 2000. This queuing operation is called "multi-queuing." The processor 710 may sequentially transfer a plurality of queued commands to the nonvolatile memory device 1100 shown in FIG. 1 through the flash interface 761.

In an embodiment, the processor 710 may control the operations of the memory controller 1200 using codes. The processor 710 may access codes stored in a memory device (not shown), loaded from a nonvolatile memory device (not shown) or the nonvolatile memory device 1100. In another embodiment, the processor 710 may load codes from the nonvolatile memory device 1100 through the flash interface 761 that communicates with the nonvolatile memory device 1100.

The flash translation section 711 of the processor 710 may map the logical address provided from the host control circuit 740 to a physical address and transfer the physical address to the flash control circuit 760. The physical address may be an address designating a data storage space in the nonvolatile memory device 1100. The flash translation section 711 may communicate with the cache memory 720 through the bus 790.

The flash control circuit 760 may be coupled between the bus 790 and the nonvolatile memory device 1100 shown in FIG. 1. The flash control circuit 760 may control the overall operations of the nonvolatile memory device 1100. In addition, the flash control circuit 760 may communicate with the flash translation section 711 through the bus 790. For example, the flash control circuit 760 may program the data from the host 2000 into the nonvolatile memory device 1100 based on the physical address from the flash translation section 711. In another example, the flash control circuit 760 may read data stored in the nonvolatile memory device 1100 based on the physical address transferred from the flash translation section 711. The flash control circuit 760 may further communicate with the cache memory 720 through the bus 790.

The flash control circuit 760 may include the flash interface 761 and the flash error correction circuit 762. The flash interface 761 may be used to communicate with the nonvolatile memory device 1100. For example, the flash interface 761 may communicate with the nonvolatile memory device 1100 using a communicating method based on a toggle interface.

The flash error correction circuit 762 may perform an error correction operation. The flash error correction circuit 762 may perform an error-correcting code (ECC) encoding operation on write data that is to be written to the nonvolatile memory device 1100. The ECC-encoded data may be transferred to the nonvolatile memory device 1100 through the flash interface 761. In addition, the flash error correction circuit 762 may receive read data output from the nonvolatile memory device 1100 and perform an ECC decoding operation on the read data.

The buffer memory control circuit 750 may control the overall operations of the buffer memory device 1300 shown in FIG. 1. For example, the buffer memory control circuit 750 may store write data provided from the host 2000 in the buffer memory device 1300 in response to an internal write command transferred from the host control circuit 740. In another example, the buffer memory control circuit 750 may store read data output from the nonvolatile memory device 1100 in the buffer memory device 1300 in response to an internal read command transferred from the flash control circuit 760. The buffer memory device 1300 may temporarily store the write data and the read data.

The buffer memory control circuit 750 may read out data stored in the buffer memory device 1300 and cache the read-out data in the cache memory 720 in response to the command transferred from the host control circuit 740 or from the flash translation section 711. The buffer memory control circuit 750 may be coupled between the buffer memory device 1300 and the cache memory 720. The buffer memory device 1300 may include a DRAM, and the buffer memory control circuit 750 may control a refresh operation of the DRAM.

The buffer memory control circuit 750 may include the buffer memory interface 751 and the buffer error correction circuit 752. The buffer memory control circuit 750 may communicate with the buffer memory device 1300 through the buffer memory interface 751 in order to transmit a command to the buffer memory device 1300 and to exchange data with the buffer memory device 1300. For example, the buffer memory interface 751 may communicate with the buffer memory device 1300 using a communicating method based on a DDR interface.

The buffer error correction circuit 752 may perform an error correction operation on data. The buffer error correction circuit 752 may perform an ECC encoding operation on data to be written to the buffer memory device 1300. The ECC-encoded data may be transferred to the buffer memory device 1300 through the buffer memory interface 751. The buffer error correction circuit 752 may receive data output from the buffer memory device 1300 and perform an ECC decoding operation on the received data.

The cache memory 720 may cache the data read (or output) from the buffer memory device 1300. In addition, the cache memory 720 may cache the data to be written to the buffer memory device 1300. The cache memory 720 may be coupled between the bus 790 and the buffer memory control circuit 750.

For example, when the host control circuit 740 receives a write command, write data, and a logical address from the host 2000 through the host interface 741, i.e., when the memory system 1000 performs a program operation, the flash translation section 711 of the processor 710 may assign a physical storage space in the nonvolatile memory device 1100 in which the write data is to be stored, e.g., a memory block or a page, in response to the write command. In other words, the flash translation section 711 may map a physical address to the logical address in response to the write command. The physical address may designate the physical storage space of the nonvolatile memory device 1100 in which the write data received from the host 2000 is to be stored.

The memory system 1000 of FIG. 1 may store mapping information between the logical address and the physical address, i.e., logical-physical address mapping information, in a memory block 110 of the nonvolatile memory device 1100. The memory block 110 storing the logical-physical address mapping information may be called a "system block."

In an embodiment, when the host control circuit 740 of the memory system 1000 receives the write command, the write data, and the logical address from the host 2000 through the host interface 741, the host control circuit 740 may transfer the write command and the logical address to the processor 710. The flash translation section 711 of the processor 710 may assign the physical storage space of the nonvolatile memory device 1100 in which the write data is to be stored in response to the write command. In other words, the flash translation section 711 may map the physical address to the logical address in response to the write command, and may store newly generated mapping information between the logical address and the physical address, namely, new logical-physical address mapping information, in the buffer memory device 1300. In other words, the flash translation section 711 may update previous logical-physical address mapping information stored in the buffer memory device 1300 based on the newly mapped physical address.

When power is on, the memory controller 1200 may read logical-physical address mapping information stored in the nonvolatile memory device 1100 and load the read logical-physical address mapping information to the buffer memory device 1300. In addition, the memory controller 1200 may flush logical-physical address mapping information stored in the buffer memory device 1300 to the nonvolatile memory device 1100. In an embodiment, the logical-physical address mapping information is flushed to the nonvolatile memory device 1100 before power is off to prevent the logical-physical address mapping information stored in the buffer memory device 1300 from being lost.

When the host control circuit 740 may receive a read command and a logical address from the host 2000 through the host interface 741, i.e., when the memory system 1000 performs a read operation, the host control circuit 740 may transfer the read command and the logical address to the processor 710. The flash translation section 711 of the processor 710 may issue an internal read command for reading logical-physical address mapping information corresponding to the logical address that is stored in the buffer memory device 1300 based on a logical address data structure, in response to the read command. The buffer memory control circuit 750 may read out the logical-physical address mapping information corresponding to the logical address from the buffer memory device 1300 and cache the read-out logical-physical address mapping information in the cache memory 720 in response to the internal read command transferred from the flash translation section 711.

Subsequently, the flash translation section 711 may extract a physical address corresponding to the logical address from the cached logical-physical address mapping information and transfer the extracted physical address to the flash control circuit 760. The flash control circuit 760 may read data stored in a storage space in the nonvolatile memory device 1100 that corresponds to the physical address transferred from the flash translation section 711. The data read from the nonvolatile memory device 1100 may be buffered in the buffer memory device 1300. Subsequently, the buffered data in the buffer memory device 1300 may be output to the host 2000.

When a read command and a logical address are provided from the host 2000, the flash translation section 711 may issue an internal read command for reading logical-physical address mapping information corresponding to the logical address that is stored in the buffer memory device 1300 as described above, and in response to the internal read command issued by the flash translation section 711, the buffer memory control circuit 750 may read out the logical-physical address mapping information from the buffer memory device 1300 and cache the logical-physical address mapping information in the cache memory 720. However, when the buffer memory device 1300 includes a DRAM, the operation of reading out the logical-physical address mapping information from the DRAM may degrade read performance of the memory system 1000.

However, in an embodiment, if information about the physical address corresponding to the logical address input from the host 2000 is cached in the cache memory 720 before the flash translation section 711 issues the internal read command for reading the logical-physical address mapping information corresponding to the logical address that is stored in the buffer memory device 1300, the flash translation section 711 can directly refer to the logical-physical address mapping information from the cache memory 720 and fetch the information about the physical address. As a result, the read performance of the memory system 1000 can be improved.

In an embodiment, the cache memory 720 may include a static random access memory (SRAM).

In an embodiment, the memory system 1000 may manage logical-physical address mapping information used for a read operation and logical-physical address mapping information generated during a write operation as one integrated type of information or separate types of information.

In an embodiment, the logical-physical address mapping information used for the read operation may be optimized for searching for a physical address corresponding to a particular logical address. As a result, the optimized logical-physical address mapping information may be efficient to search for the physical address mapped to the logical address provided from the host 2000 during the read operation.

In an embodiment, the logical-physical address mapping information generated during the write operation may be optimized for the write operation. The flash translation section 711 of the memory controller 1200 may quickly assign a storage space in the nonvolatile memory device 1100 in which write data is to be stored when the flash translation section 711 receives a write command, the write data, and a logical address from the host 2000. In order to assign the storage space quickly, the buffer memory device 1300 may store a list of physical addresses corresponding to storage spaces in the nonvolatile memory device 1100 which can be newly assigned. When the flash translation section 711 receives the write command, the write data, and the logical address from the host 2000, the flash translation section 711 may search the list and map a physical address corresponding to a storage space in which the write data is to be stored to the logical address, and may store the write data in the storage space corresponding to the physical address. The logical-physical address mapping information for the write operation may be generated and temporarily stored in the buffer memory device 1300. Subsequently, the logical-physical address mapping information stored in the buffer memory device 1300 may be flushed into the nonvolatile memory device 1100, to update logical-physical address mapping information stored in the nonvolatile memory device 1100 and to prevent the logical-physical address mapping information stored in the buffer memory device 1300 from being lost when power is off.

In other words, in the buffer memory device 1300, the logical-physical address mapping information for the read operation and the logical-physical address mapping information generated or updated during the write operation may be managed separately. However, after the logical-physical address mapping information stored in the buffer memory device 1300 is flushed into the nonvolatile memory device 1100, the two types of the logical-physical address mapping information may be integrated and managed in the nonvolatile memory device 1100.

In another embodiment, the host control circuit 740 may receive a read command and a logical address from the host 2000 through the host interface 741. The host control circuit 740 may issue a first internal read command for reading logical-physical address mapping information corresponding to the logical address based on a logical address data structure stored in the buffer memory device 1300. The buffer memory control circuit 750 may read the logical-physical address mapping information corresponding to the logical address that is stored in the buffer memory device 1300, and may cache the logical-physical address mapping information into the cache memory 720, in response to the first internal read command transferred from the host control circuit 740. Subsequently, the host control circuit 740 may transfer the read command and the logical address received from the host 2000 to the processor 710.

The flash translation section 711 of the memory controller 1200 may issue a second internal read command for reading the logical-physical address mapping information corresponding to the logical address that is stored in the buffer memory device 1300 based on the logical address data structure in response to the read command. At this time, since the logical-physical address mapping information is already cached in the cache memory 720, the flash translation section 711 may directly refer to the logical-physical address mapping information from the cache memory 720 and fetch information about a physical address corresponding to the logical address from the logical-physical address mapping information that has been cached in the cache memory 720.

The flash translation section 711 may transfer the information about the physical address corresponding to the logical address to the flash control circuit 760 through the bus 790. The flash control circuit 760 may read data stored in a storage space in the nonvolatile memory device 1100 based on the physical address transferred from the flash translation section 711. The data read from the nonvolatile memory device 1100 may be buffered in the buffer memory device 1300. Subsequently, the data buffered in the buffer memory device 1300 may be output to the host 2000.

As described above, the host control circuit 740 may issue the first internal read command for reading the logical-physical address mapping information corresponding to the logical address that is stored in the buffer memory device 1300 based on the logical address data structure before the host control circuit 740 transfers information about the logical address to the flash translation section 711. As a result, the logical-physical address mapping information stored in the buffer memory device 1300 can be cached to the cache memory 720 before the flash translation section 711 issues the second internal read command for reading the logical-physical address mapping information, and then the flash translation section 711 can read out the physical address corresponding to the logical address from the logical-physical address mapping information cached in the cache memory 720. Accordingly, in this embodiment, even though the buffer memory device 1300 includes a DRAM, the memory system 1000 may read out the physical address corresponding to the logical address at a higher speed compared to the above embodiment in which the logical-physical address mapping information stored in the buffer memory device 1300 is read out and cached to the cache memory 720 in response to the internal read command issued by the flash translation section 711. As a result, the read performance of the memory system 1000 may be improved.

In other words, an operation of reading information about a physical address corresponding to a logical address from the buffer memory device 1300 and caching the information about the physical address in the cache memory 720 may be performed by the host control circuit 740, and then the flash translation section 711 may check the physical address mapped to the logical address by referring to the cache memory 720, rather than referring to the buffer memory device 1300. As a result, the physical address checking operation may be performed in a shorter time, and thus the read performance of the memory system 1000 may be improved.

Figure 6:
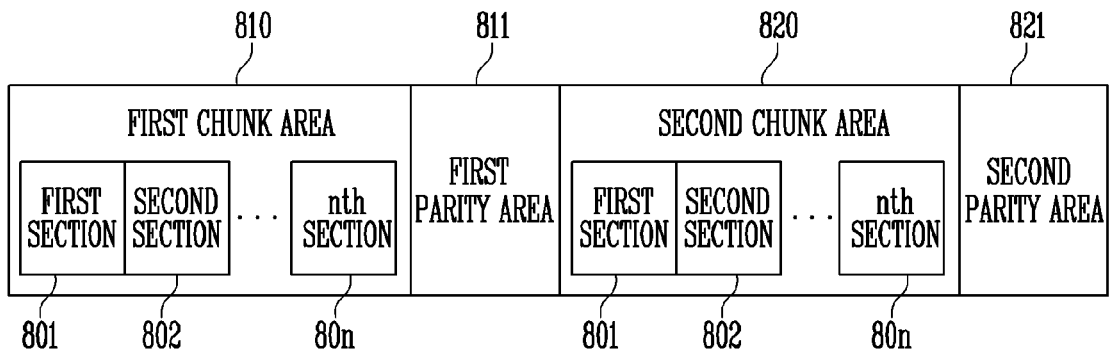
FIG. 6 is a diagram illustrating data and parity storage areas of a buffer memory device according to an embodiment.

FIG. 6 is a diagram illustrating data and parity storage areas of the buffer memory device 1300 shown in FIG. 1 according to an embodiment. The buffer memory device 1300 shown in FIG. 6 will be described with reference to FIG. 5.

Referring to FIG. 6, the buffer memory device 1300 may store logical-physical address mapping information based on a logical address data structure. A memory cell array of the buffer memory device 1300 may include first and second chunk areas 810 and 820 and first and second parity areas 811 and 821. In addition, each of the first and second chunk areas 810 and 820 may include first to $n^{th}$ sections 801 to 80n, n being a positive integer.

The first chunk area 810 may store chunk data, and the first parity area 811 may store parity data generated as a result of performing an ECC encoding operation on the chunk data which is to be stored in the first chunk area 810, wherein the ECC encoding operation is performed by the buffer error correction circuit 752 shown in FIG. 5. The chunk data may be the logical-physical address mapping information used for the nonvolatile memory device 1100. In addition, the second chunk area 820 may store chunk data, and the second parity area 821 may store parity data generated as a result of performing an ECC encoding operation on the chunk data which is to be stored in the second chunk area 820, wherein the ECC encoding operation is performed by the buffer error correction circuit 752. In other words, the chunk data stored in each of the first and second chunk areas 810 and 820 may be a unit of the ECC encoding or ECC decoding operation.

For example, the chunk data stored in each of the first and second chunk areas 810 and 820 may have 128 bytes of data. Parity data corresponding to the 128 bytes of chunk data may have 2 bytes of data. In other words, the buffer error correction circuit 752 may generate the 2 bytes of parity data by performing the ECC encoding operation on the 128 bytes of chunk data.

In an embodiment, when a write request to write data in the first chunk area 810 of the buffer memory device 1300 is generated by the processor 710, the processor 710 shown in FIG. 5 may temporarily cache the data in the cache memory 720. The buffer error correction circuit 752 may perform the ECC encoding operation on the data cached in the cache memory 720 and transfer ECC-encoded data to the buffer memory device 1300. In other words, when the write request to write the data in the first chunk area 810 of the buffer memory device 1300 is generated by the processor 710, the processor 710 may control the cache memory 720 to temporarily store the data, and the buffer error correction circuit 752 may perform the ECC encoding operation on the data cached in the cache memory 720 under the control of the processor 710.

The ECC-encoded data may include chunk data and parity data. The processor 710 may write the chunk data in the first chunk area 810 of the buffer memory device 1300, and may write the parity data in the first parity area 811 of the buffer memory device 1300.

For example, when a write request to write section data in the first section 801 of the first chunk area 810 of the buffer memory device 1300 is generated, the processor 710 may read chunk data stored in the first chunk area 810 and parity data stored in the first parity area 811, and may control the buffer error correction circuit 752 to perform an ECC decoding operation on the chunk data and the parity data, which are read from the first chunk area 810 and the first parity area 811, respectively. As a result of the ECC decoding operation, ECC-decoded chunk data is output. In addition, the processor 710 may cache the ECC-decoded chunk data in the cache memory 720.

Subsequently, the processor 710 may modify data corresponding to the first section 801 in the ECC-decoded chunk data that is cached in the cache memory 720 with the section data to thereby output modified ECC-decoded chunk data in which the data corresponding to the first section 810 is modified with the section data. After that, the processor 710 may control the buffer error correction circuit 752 to perform the ECC encoding operation on the modified ECC-decoded chunk data and to output modified ECC-encoded chunk data. The processor 710 may write the modified ECC-encoded chunk data and corresponding parity data to the first chunk area 810 and the first parity area 811 of the buffer memory device 1300, respectively. For example, when data stored in each of the first to $n^{th}$ sections 801 to 80n has 2 bytes of data, the processor 710 may perform a write or read operation on the buffer memory device 1300 by 2 bytes of data. As described above, when the processor 710 writes data, which has a smaller size than a unit of the ECC encoding or the ECC decoding, e.g., the 128 bytes of chunk data, in the buffer memory device 1300, the write operation may be performed through a read-modify-write operation described above.

When a read request to read section data stored in the first section 801 of the first chunk area 810 of the buffer memory device 1300 is generated, the processor 710 may read chunk data stored in the first chunk area 810 and parity data stored in the first parity area 811, and may control the buffer error correction circuit 752 to perform the ECC decoding operation on the chunk data and the parity data in order to generate ECC decoded chunk data. In other words, the buffer error correction circuit 752 may perform the ECC decoding operation on the chunk data and the parity data under the control of the processor 710.

In addition, the processor 710 may cache the ECC-decoded chunk data in the cache memory 720. The cache memory 720 may output the section data corresponding to the first section 801 that is included in the ECC-decoded chunk data under the control of the processor 710.

For example, a plurality of section data included in single chunk data may respectively correspond to mapping information between a single logical address and a single physical address. For example, the plurality of section data included in the single chunk data may include mapping information for a plurality of successive logical addresses.

Figure 7:
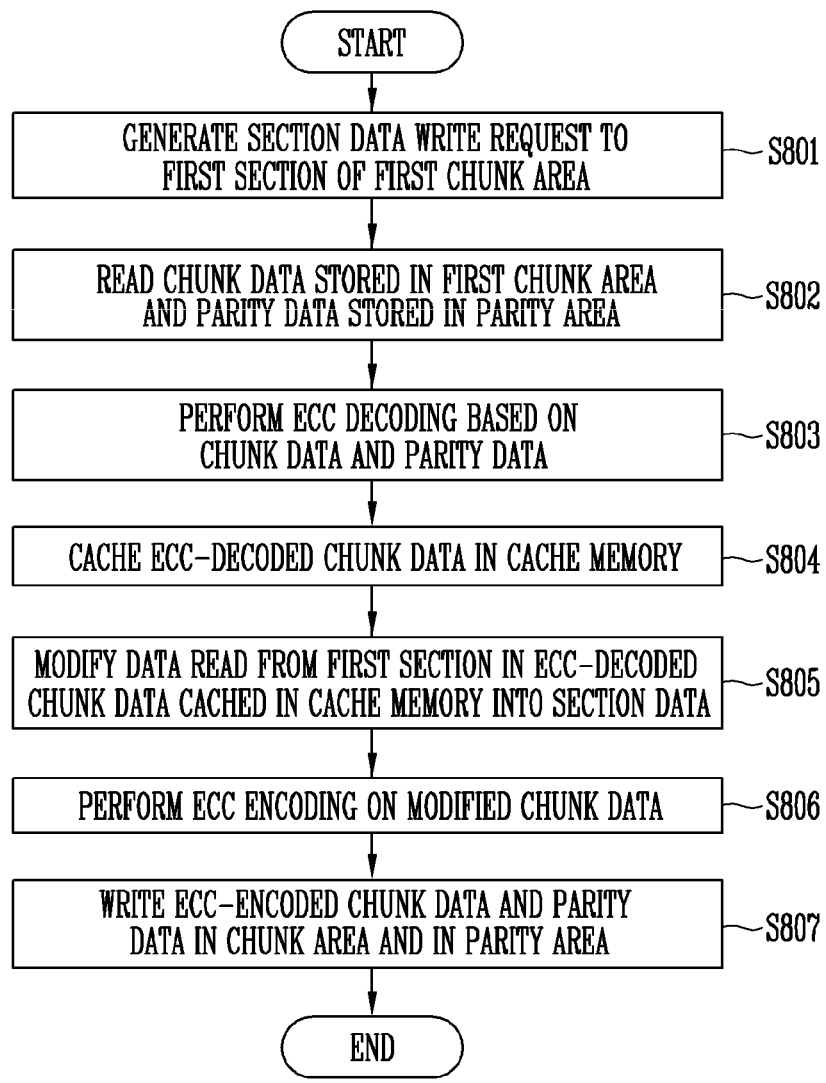
FIG. 7 is a flowchart illustrating a data write method of a buffer memory device according to an embodiment.

FIG. 7 is a flowchart illustrating a data write method of the buffer memory device 1300 shown in FIG. 1 according to an embodiment. The data write method shown in FIG. 7 will be described with reference to FIGS. 1, 5, and 6.

Referring to FIG. 7, for example, a write request to write section data in a section, e.g., the first section 801 of the first chunk area 810, of the buffer memory device 1300 may be generated by the flash translation section 711 of the processor 710 (step S801). For example, when the memory system 1000 shown in FIG. 1 receives a write command and a logical address from the host 2000, the flash translation section 711 of the processor 710 may map a physical address to the logical address. In addition, the flash translation section 711 may modify logical-physical address mapping information stored in the buffer memory device 1300 based on the mapping result. To modify the logical-physical address mapping information stored in the buffer memory device 1300, the flash translation section 711 may generate the write request to write the section data in the buffer memory device 1300. For example, mapping information between a single logical address and a single physical address may be stored, as section data, in a single section of the buffer memory device 1300.

To write the section data in the first section 801 of the first chunk area 810 of the buffer memory device 1300, the processor 710 may read chunk data stored in the first chunk area 810 of the buffer memory device 1300 and parity data stored in the first parity area 811 of the buffer memory device 1300 based on the write request (step S802).

After that, the buffer error correction circuit 752 may perform an ECC decoding operation on the chunk data read from the first chunk area 810 and the parity data read from the first parity area 811 under the control of the processor 710 (step S803). The cache memory 720 may cache the ECC-decoded chunk data under the control of the processor 710 (step S804).

Subsequently, the processor 710 may modify data corresponding to the first section 801 in the ECC-decoded chunk data cached in the cache memory 720 with the section data (step S805). The buffer error correction circuit 752 may perform an ECC encoding operation on the modified chunk data including the section data under the control of the processor 710 (step S806). The ECC-encoded data may include the modified chunk data and parity data for the modified chunk data.

Subsequently, the buffer memory device 1300 may store the ECC-encoded chunk data and the parity data in the first chunk area 810 of the buffer memory device 1300 and the first parity area 811 of the buffer memory device 1300, respectively, under the control of the processor 710 (step S807).

As described above, when a write request is generated to write data having a smaller size than a unit of the ECC encoding, the write request may be performed through a read-modify-write operation described in FIG. 7. The data having the smaller size may correspond to section data to be stored in a single section of a chunk area of the buffer memory device 1300.

Figure 8:
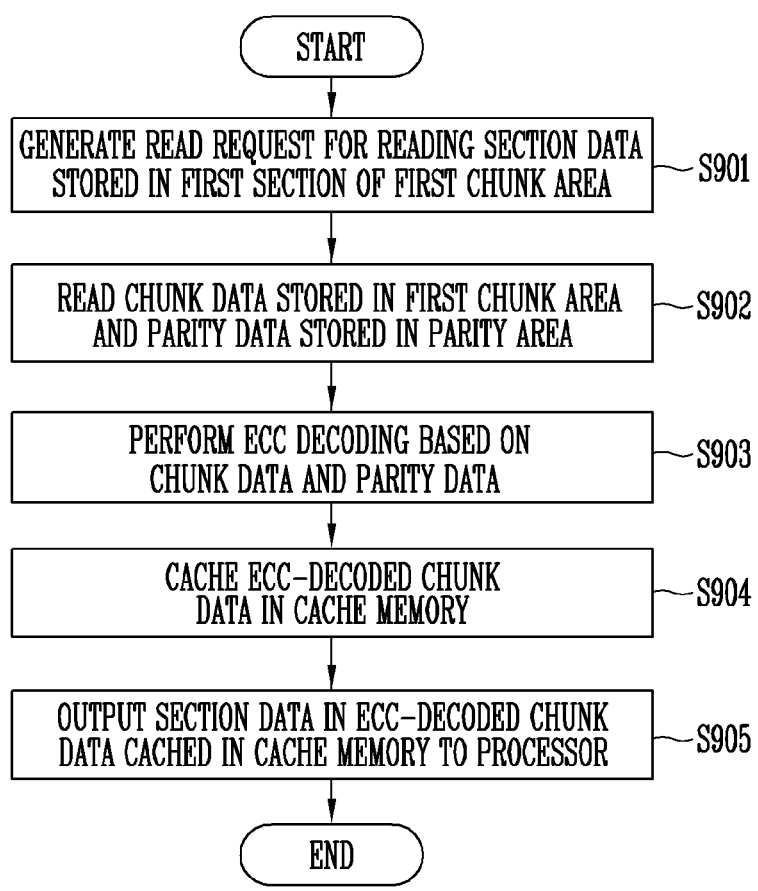
FIG. 8 is a flowchart illustrating a data read method of a buffer memory device according to an embodiment.

FIG. 8 is a flowchart illustrating a data read method of the buffer memory device 1300 shown in FIG. 1 according to an embodiment. The data read method shown in FIG. 8 will be described with reference to FIGS. 1, 5, and 6.

Referring to FIG. 8, for example, a read request to read section data stored in the first section 801 of the first chunk area 810 of the buffer memory device 1300 may be generated (step S901). For example, when the memory system 1000 shown in FIG. 1 receives a read command and a logical address from the host 2000, the flash translation section 711 or the host control circuit 740 may issue an internal read command for reading a physical address that is mapped to the logical address to the buffer memory device 1300. At this time, the read request for reading section data stored in the buffer memory device 1300 may be generated. For example, mapping information between a single logical address and a single physical address may be stored in a single section of the buffer memory device 1300 as section data.

The read request may be generated when the read command for the nonvolatile memory device 1100 is input from the host 2000. When the memory system 1000 receives the read command and the logical address for the nonvolatile memory device 1100 from the host 2000, the memory system 1000 may read section data stored in the buffer memory device 1300 to check the physical address corresponding to the logical address in response to the read command. The section data stored in the buffer memory device 1300 may include information about the physical address which is mapped to the logical address, namely, logical-physical address mapping information between the logical address and the physical address. In an embodiment, the read request to read the logical-physical address mapping information including a mapping relationship between the logical address and the physical address from the buffer memory device 1300 may be generated by the processor 710. In another embodiment, the read request may be generated by the host control circuit 740 or the processor 710.

The processor 710 may read chunk data stored in the first chunk area 810 of the buffer memory device 1300 and parity data stored in the first parity area 811 of the buffer memory device 1300 in response to the read request (step S902).

After step S902, the buffer error correction circuit 752 may perform an ECC decoding operation on the chunk data and the parity data which are read from the first chunk area 810 and the first parity area 811 of the buffer memory device 1300, respectively, under the control of the processor 710 (step S903). The cache memory 720 may cache the ECC-decoded chunk data under the control of the flash translation section 711 or the host control circuit 740 (step S904).

Subsequently, the section data included in the ECC-decoded chunk data that has been cached in the cache memory 720 may be output to the processor 710 (step S905).

Figure 9:
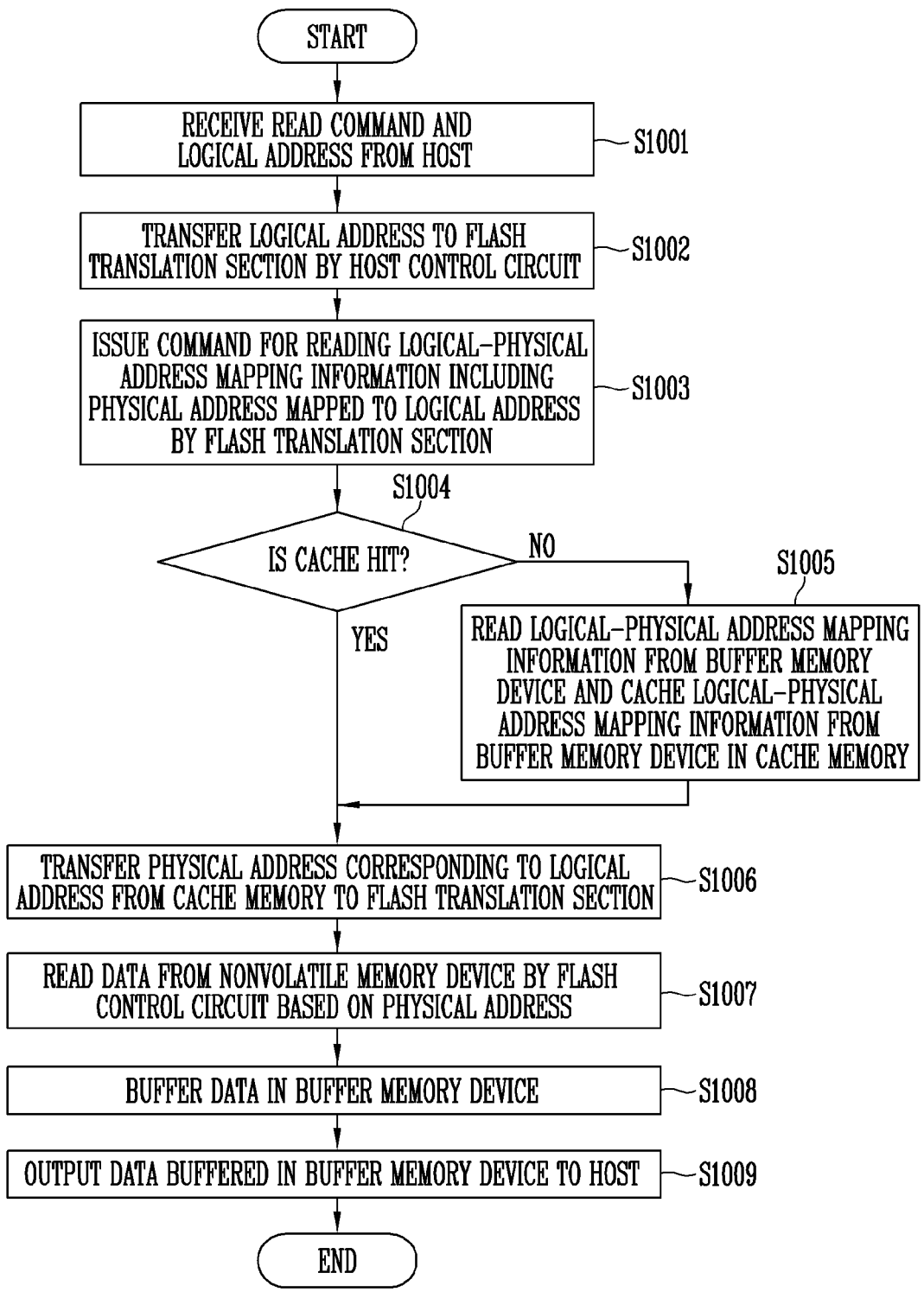
FIG. 9 is a flowchart illustrating a read operation according to an embodiment.

FIG. 9 is a flowchart illustrating a read operation of the memory system 1000 shown in FIG. 1 according to an embodiment. The read operation shown in FIG. 9 will be described with reference to FIGS. 1, 5, and 6.

Referring to FIG. 9, the host control circuit 740 of the memory system 1000 may receive a read command and a logical address from the host 2000 through the host interface 741 (step S1001).

Subsequently, the host control circuit 740 may transfer the logical address input from the host 2000 to the flash translation section 711 (step S1002).

The flash translation section 711 may issue an internal read command for reading logical-physical address mapping information that includes a physical address mapped to the logical address (step S1003).

It is determined whether there is a cache hit (step S1004). When the logical-physical address mapping information including the physical address is not cached in the cache memory 720, that is, when there is no cache hit, the buffer memory control circuit 750 may read the logical-physical address mapping information from the buffer memory device 1300 and cache the logical-physical address mapping information in the cache memory 720 (step S1005).

Subsequently, the physical address corresponding to the logical address may be transferred from the cache memory 720 to the flash translation section 711 (step S1006).

The flash translation section 711 may transfer information about the physical address to the flash control circuit 760, and the flash control circuit 760 may read data from the nonvolatile memory device 1100 based on the physical address (step S1007).

The data output from the nonvolatile memory device 1100 may be buffered in the buffer memory device 1300 (step S1008).

Subsequently, the data buffered in the buffer memory device 1300 may be output to the host 2000 (step S1009).

At step S1004, when it is determined that there is a cache hit, i.e., when the logical-physical address mapping information including the physical address that is mapped to the logical address is already cached in the cache memory 720, the read operation directly goes to step S1006 without performing step S1005, such that the physical address cached in the cache memory 720 is transferred from the cache memory 720 to the flash translation section 711. Accordingly, a read latency of the memory system 1000 may decrease compared to the case where step S1005 is performed.

Figure 10:
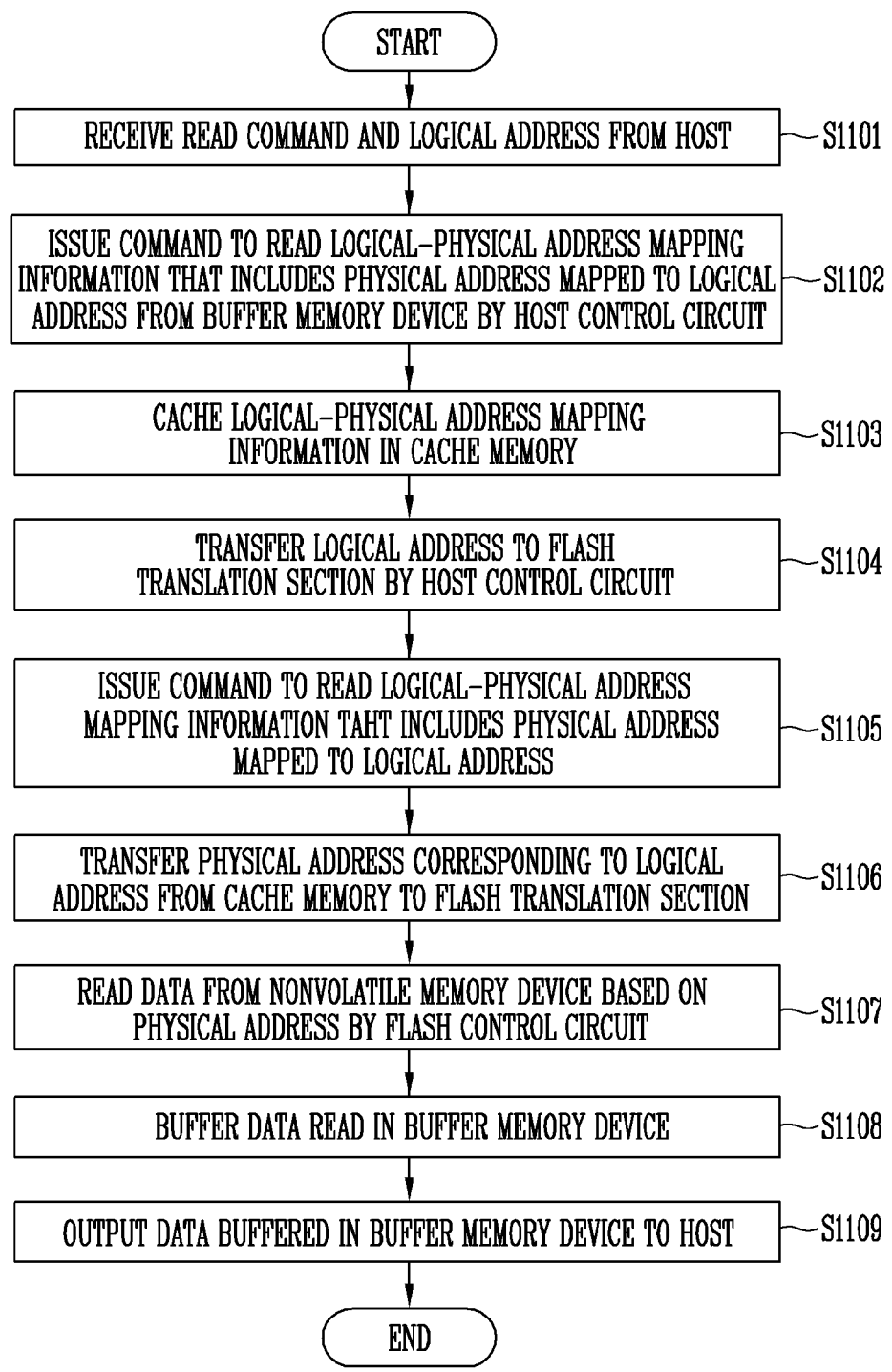
FIG. 10 is a flowchart illustrating a read operation according to another embodiment.

FIG. 10 is a flowchart illustrating a read operation of the memory system 1000 shown in FIG. 1 according to another embodiment. The read operation shown in FIG. 10 will be described with reference to FIGS. 1, 5, and 6.

Referring to FIG. 10, the host control circuit 740 of the memory system 1000 may receive a read command and a logical address from the host 2000 through the host interface 741 (step S1101).

The host control circuit 740 may issue a command (e.g., first command) to read logical-physical address mapping information that includes a physical address mapped to the logical address, based on a logical address data structure, from the buffer memory device 1300 (step S1102).

Subsequently, the logical-physical address mapping information that is read from the buffer memory device 1300 in response to the first command may be cached in the cache memory 720 (step S1103).

Subsequently, the host control circuit 740 may transfer the logical address to the flash translation section 711 (step S1104).

The flash translation section 711 may issue a command (e.g., second command) to read the logical-physical address mapping information that includes the physical address mapped to the logical address (step S1105).

The physical address corresponding to the logical address may be read from the cache memory 720 and transferred to the flash translation section 711 directly from the cache memory 720 in response to the second command (step S1106). An operation of reading the logical-physical address mapping information from the buffer memory device 1300 may be skipped since the logical-physical address mapping information has been cached in the cache memory 720 in response to the first command issued by the host control circuit 740, thereby speeding up the read process.

The flash translation section 711 may transfer information about the physical address to the flash control circuit 760, and the flash control circuit 760 may read data from the nonvolatile memory device 1100 based on the physical address (step S1107).

The data output (or read data) from the nonvolatile memory device 1100 may be buffered in the buffer memory device 1300 (step S1108). Subsequently, the data buffered in the buffer memory device 1300 may be output to the host 2000 (step S1109).

Figure 11:
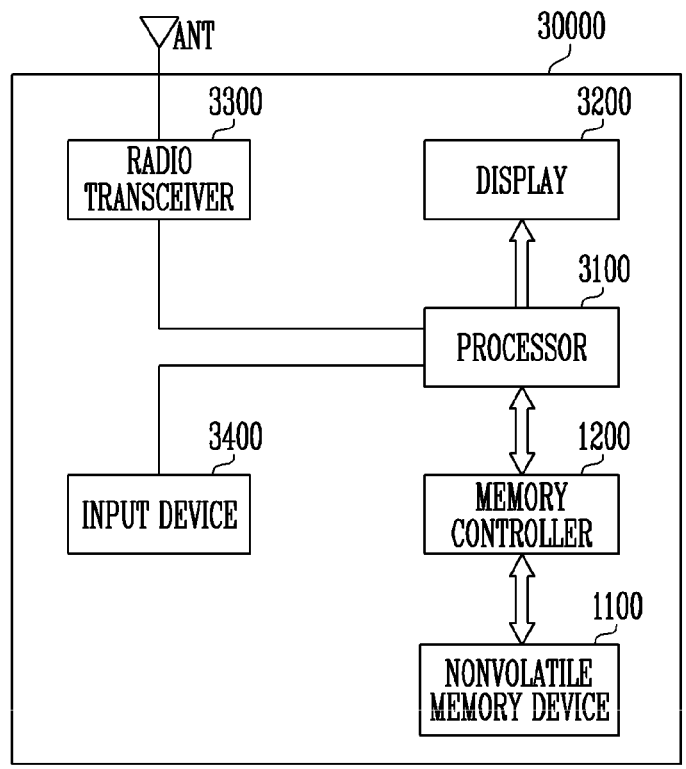
FIG. 11 is a diagram illustrating a memory system according to an embodiment.

FIG. 11 is a diagram illustrating a memory system 30000 according to an embodiment.

Referring to FIG. 11, the memory system 30000 may be embodied in a cellular phone, a smartphone, a tablet PC, a personal digital assistant (PDA), or a wireless communication device. The memory system 30000 may include a nonvolatile memory device 1100 and a memory controller 1200 controlling operations of the nonvolatile memory device 1100. The memory controller 1200 may control a data access operation of the nonvolatile memory device 1100, such as, a program operation, an erase operation, or a read operation, under the control of a processor 3100.

The memory controller 1200 may control data programmed into the nonvolatile memory device 1100 to be output through a display 3200.

A radio transceiver 3300 may transmit or receive a radio signal through an antenna ANT. For example, the radio transceiver 3300 may change a radio signal received through the antenna ANT into a signal that can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the nonvolatile memory device 1100. In addition, the radio transceiver 3300 may change a signal output from the processor 3100 into a radio signal, and output the radio signal to an external device through the antenna ANT. A control signal for controlling the operations of the processor 3100 or data to be processed by the processor 3100 may be input through an input device 3400. The input device 3400 may include a pointing device, such as a touch pad or a computer mouse, a keypad, a keyboard, or the like. The processor 3100 may control operations of the display 3200 so that data provided by the memory controller 1200, data provided by the radio transceiver 3300, or data provided by the input device 3400 may be output through the display 3200.

According to an embodiment, the memory controller 1200 controlling the operations of the nonvolatile memory device 1100 may be implemented in the processor 3100, or be implemented in a separate chip from the processor 3100. The memory controller 1200 of FIG. 11 may be implemented with the memory controller 1200 illustrated in FIG. 1.

Figure 12:
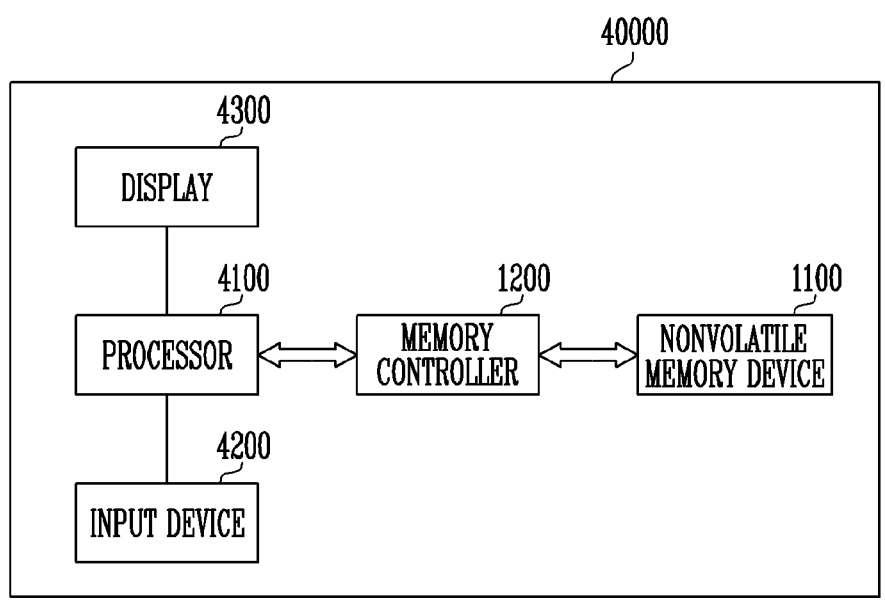
FIG. 12 is a diagram illustrating a memory system according to an embodiment.

FIG. 12 is a diagram illustrating a memory system 40000 according to an embodiment.

Referring to FIG. 12, the memory system 40000 may be provided in a personal computer (PC), a tablet PC, a net-book, an e-reader, a personal digital assistant (PDA), a portable multimedia player (PMP), an MP3 player, an MP4 player, or the like.

The memory system 40000 may include a nonvolatile memory device 1100 and a memory controller 1200 controlling data processing operations of the nonvolatile memory device 1100.

A processor 4100 may output data stored in the nonvolatile memory device 1100 through a display 4300 according to data input through an input device 4200. The input device 4200 may include a pointing device, such as a touch pad or a computer mouse, a keypad, a keyboard, or the like.

The processor 4100 may control general operations of the memory system 40000 and control operations of the memory controller 1200. According to an embodiment, the memory controller 1200 controlling the operations of the nonvolatile memory device 1100 may be implemented in the processor 4100, or be implemented in a separate chip from the processor 4100. The memory controller 1200 of FIG. 12 may be implemented with the memory controller 1200 illustrated in FIG. 1.

Figure 13:
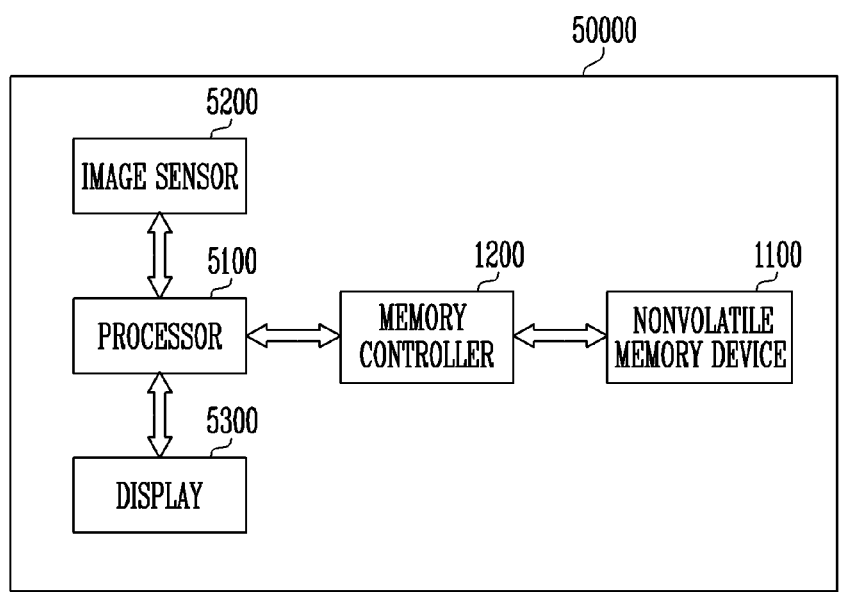
FIG. 13 is a diagram illustrating a memory system according to an embodiment.

FIG. 13 is a diagram illustrating a memory system 50000 according to an embodiment.

Referring to FIG. 13, the memory system 50000 may be provided in an image processing device such as a digital camera, or an electronic device to which a digital camera is attached, such as a mobile phone, a smartphone, a tablet PC, or the like.

The memory system 50000 may include a nonvolatile memory device 1100 and a memory controller 1200 controlling data processing operations of the nonvolatile memory device 1100, such as a program operation, an erase operation, and a read operation.

An image sensor 5200 of the memory system 50000 may convert an optical image into digital signals, and the digital signals may be transferred to a processor 5100 or the memory controller 1200. Under the control of the processor 5100, the digital signals may be output through a display 5300 or stored in the nonvolatile memory device 1100 through the memory controller 1200. In addition, the processor 5100 or the memory controller 1200 may control data stored in the nonvolatile memory device 1100 to be output through the display 5300.

According to an embodiment, the memory controller 1200 controlling the operations of the nonvolatile memory device 1100 may be implemented in the processor 5100, or be implemented in a separate chip from the processor 5100. The memory controller 1200 of FIG. 13 may be implemented with the memory controller 1200 illustrated in FIG. 1.

Figure 14:
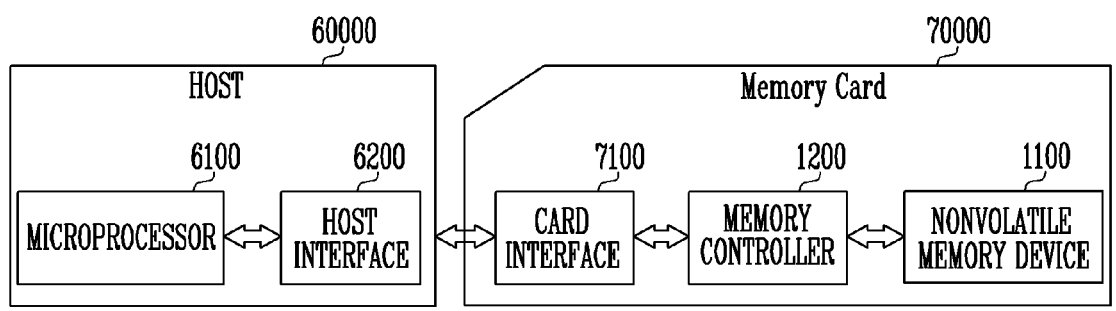
FIG. 14 is a diagram illustrating a memory system according to an embodiment.

FIG. 14 is a diagram illustrating a memory system 70000 according to an embodiment.

Referring to FIG. 14, the memory system 70000 may include a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In an embodiment, the card interface 7100 may be, but not limited to, a secure digital (SD) card interface or a multi-media card (MMC) interface. The memory controller 1200 of FIG. 14 may be implemented with the memory controller 1200 illustrated in FIG. 1.

The card interface 7100 may perform data exchange between a host 60000 and the memory controller 1200 according to a protocol of the host 60000. According to an embodiment, the card interface 7100 may support any of a Universal Serial Bus (USB) protocol and an InterChip (IC)-USB protocol. The card interface 7100 may refer to hardware capable of supporting a protocol that is used by the host 60000, software installed in the hardware, or a signal transmission method.

When the memory system 70000 is connected to a host interface 6200 of the host 60000, the host interface 6200 may perform data communication with the nonvolatile memory device 1100 through the card interface 7100 and the memory controller 1200, under the control of a microprocessor 6100. The host 60000 may include any of a PC, a tablet PC, a digital camera, a digital audio player, a cellular phone, console video game hardware, and a digital set-top box.

As described above, according to the embodiments of the present disclosure, a memory system may reduce a time required to read data stored in a buffer memory device by caching logical-physical address mapping information in a cache memory.

It will be apparent to those skilled in the art that various modifications can be made to the above-described embodiments of the present disclosure without departing from the spirit or scope of the invention. In an embodiment, a memory system (or SSD) comprises a nonvolatile memory device; a buffer memory device configured to store logical-physical address mapping information; and a memory controller (or SSD controller) including a cache memory coupled between the buffer memory device and a bus. Thus, it is intended that the present invention cover all such modifications provided they come within the scope of the appended claims and their equivalents.

Hereinafter, other embodiments of the memory system 1000 will be described.

Method of improving DRAM ECC Engine for Memory System

The disclosure in U.S. patent application Ser. No. 16/871,775, is incorporated herein by reference in its entirety.

In an embodiment, a memory system outputs meta data to be read directly from a cache memory in response to a write request when the meta data to be read exists among meta data that have been cached, as illustrated in FIG. 12 of U.S. patent application Ser. No. 16/871,775, which is incorporated herein by reference in its entirety.

Figure 15:
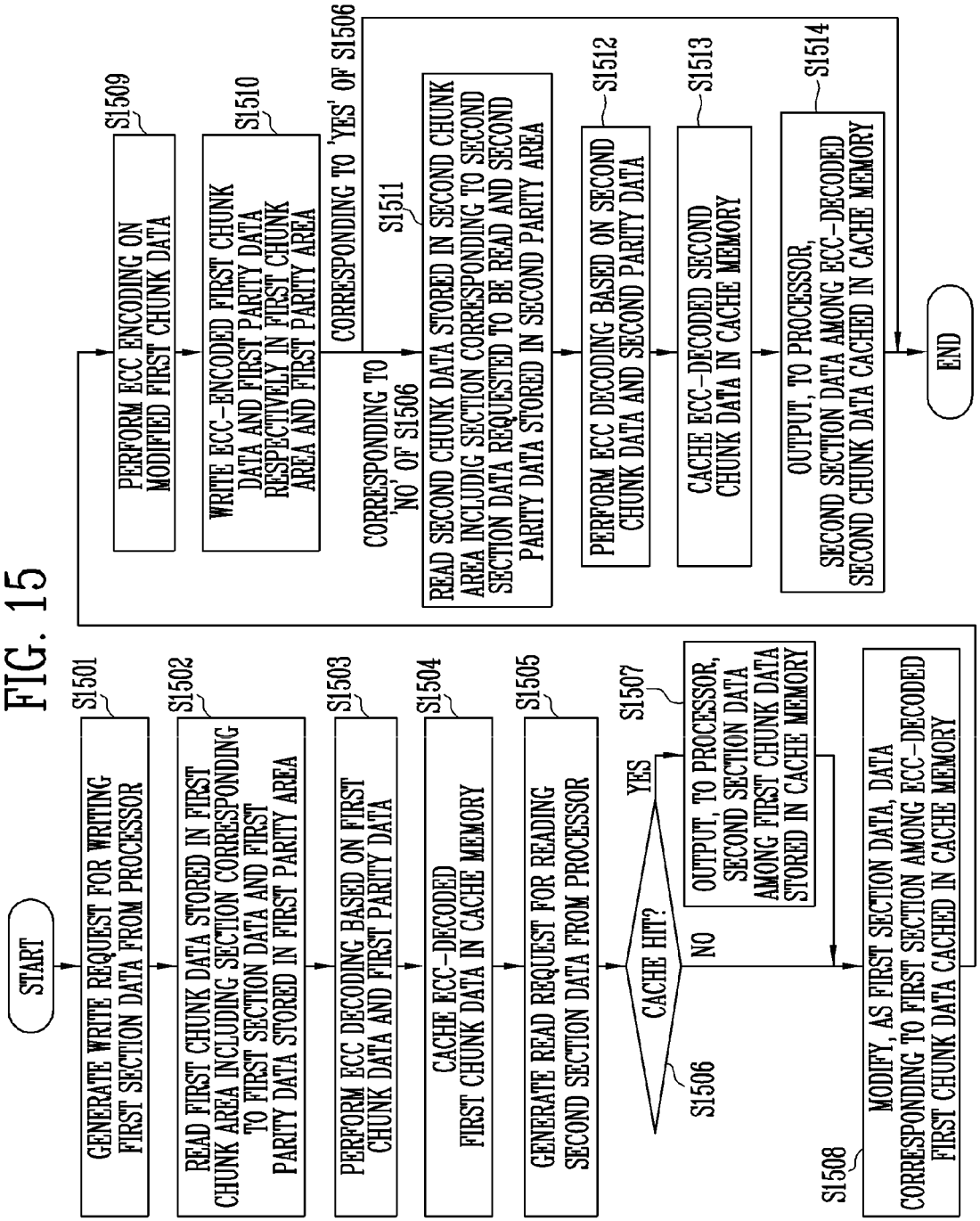
FIG. 15 illustrates a data reading and writing method of a buffer memory device according to an embodiment.

FIG. 15 illustrates a data reading and writing process of a buffer memory device (e.g., the buffer memory device 1300 of FIG. 1) according to an embodiment, which corresponds to FIG. 12 of U.S. patent application Ser. No. 16/871,775.

Referring to FIG. 15, at step S1501, a processor (e.g., the processor 710 of FIG. 5) may generate a write request for writing first section data into a section (e.g. the first section 801 of FIG. 6) of a chunk area (e.g., the first chunk area 810 of FIG. 6) of the buffer memory device 1300. At step S1502, the processor 710 may read first chunk data stored in the first chunk area 810 of the buffer memory device 1300 and first parity data stored in the first parity area 811 of the buffer memory device 1300 in response to the write request.

At step S1503, an error correction circuit (e.g., the buffer error correction circuit 752 of FIG. 5) may perform an ECC decoding operation based on the first chunk data read from the first chunk area 810 and the first parity data read from the first parity area 811. At step S1504, a cache memory (e.g., the cache memory 720 of FIG. 5) may cache the ECC-decoded first chunk data under the control of the processor 710.

Then, at step S1505, the processor 710 may generate a read request for reading second section data stored in a section (e.g., the second section 802 of the first chunk area 810 or the second section 802 of the second chunk area 820 of FIG. 6).

At step S1506, the processor 710 may check whether the second section data requested to be read has been cached in the cache memory 720. When the second section data has been cached in the cache memory 720, i.e., in a cache hit (corresponding to "YES" of step S1506), the cache memory 720 may immediately output the second section data among the ECC-decoded first chunk data stored therein to the processor 710 at step S1507. In other words, the second section data requested to be read is data stored in the second section 802 of the first chunk area 810, rather than that stored in the second section 802 of the second chunk area 820.

At step S1508, the processor 710 may modify a portion of the cached first chunk data corresponding to the first section 801 of the first chunk area 810 into the first section data. At step S1509, the buffer error correction circuit 752 may perform an ECC encoding operation on the modified first chunk data including the first section data under the control of the processor 710. For example, the ECC-encoded data may include the modified first chunk data including the first section data and first parity data corresponding to the modified first chunk data. In another example, step S1508 may be performed between step S1504 and step S1505. As a result, step S1509 may be performed immediately after step S1507.

At step S1510, the buffer memory device 1300 may write the ECC-encoded first chunk data and first parity data respectively in the first chunk area 810 and the first parity area 811 of the buffer memory device 1300 under the control of the processor 710.

When the cache memory 720 contains the second section data to be read, i.e., in the cache hit (corresponding to "YES" of step S1506), the process is completed after step S1510. Both of the write request and the read request may be executed through the above-described steps.

When the second section data requested to be read does not exist in the cached first chunk data in the cache memory 720, i.e., in a cache miss (corresponding to "NO" of step S1506), steps S1508, S1509, and S1510 may be performed without performing step S1507. For example, the second section data requested to be read is data stored in the second section 802 of the second chunk area 820, rather than in the second section 802 of the first chunk area 810.

Then, at step S1511, second chunk data stored in the second chunk area 820 including the second section data requested to be read and second parity data stored in the second parity area 821 may be read.

At step S1512, the buffer error correction circuit 752 may perform an ECC decoding operation based on the read second chunk data and the read second parity data under the control of the processor 710. At step S1513, the cache memory 720 may cache the ECC-decoded second chunk data under the control of the processor 710.

Then, at step S1514, the second section data among the ECC-decoded second chunk data stored in the cache memory 720 may be output to the processor 710.

When the cache memory 720 does not contain the second section data to be read, i.e., in the cache miss (corresponding to "NO" of step S1506), the process is completed after step S1514. Both of the write request and the read request may be executed through the above-described steps.

As described above, when data to be read in response to a read request exists among data that the memory system 1000 has read from the buffer memory device 1300 and stored in the cache memory 720 in response to a write request, i.e., in a cache hit, the memory system 1000 may output the data to be read directly from the cache memory 720, rather than performing a separate operation of reading data from the buffer memory device 1300. Thus, latency following the read request can be reduced. Consequently, the read performance of the memory system 1000 can be improved.

Method of Optimizing FTL Performance by Non-Cache-Updated Read

The disclosure in U.S. patent application Ser. No. 16/781,309, is incorporated herein by reference in its entirety.

In another embodiment, a cache memory caches meta data only when the meta data received from a buffer memory device has locality, as illustrated in FIG. 6 of U.S. patent application Ser. No. 16/781,309, which is incorporated herein by reference in its entirety.

Figure 16:
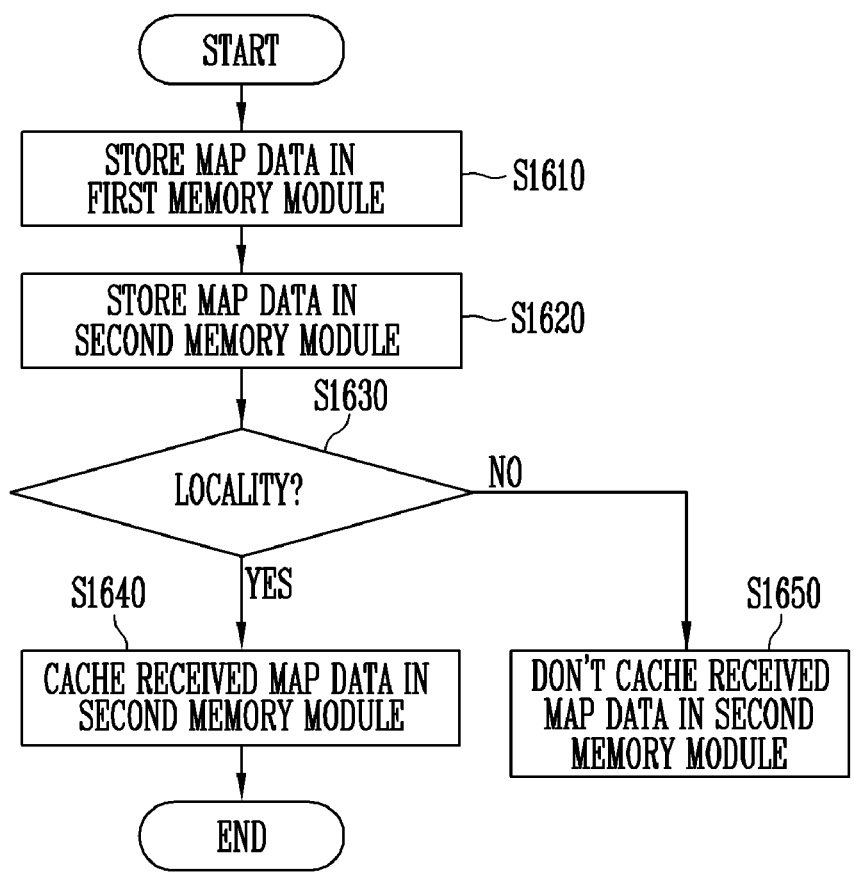
FIG. 16 illustrates an operating method of a memory system in accordance with an embodiment.

FIG. 16 illustrates an operating method of a memory system (e.g., the memory system 1000 of FIG. 1) in accordance with an embodiment, which corresponds to FIG. 6 of U.S. patent application Ser. No. 16/781,309.

Referring to FIG. 16, in operation S1610, a memory controller (e.g., the memory controller 1200 of FIG. 1) may store (i.e., cache) a plurality of pieces of map data received from a memory device (e.g., the nonvolatile memory device 1100 of FIG. 1) in a first memory module (e.g., the buffer memory device 1300 of FIG. 1).

In an embodiment, the memory controller 1200 may add a parity to the plurality of pieces of map data by performing encoding on the plurality of pieces of map data through a second memory module (e.g., the cache memory 720 of FIG. 5), and store the plurality of pieces of map data, to which the parity is added, in the buffer memory device 1300.

In operation S1620, the memory controller 1200 may transmit at least one piece of map data among the plurality of pieces of map data stored in the buffer memory device 1300 to the cache memory 720 from the buffer memory device 1300. The cache memory 720 may perform decoding on the plurality of pieces of map data received from the buffer memory device 1300.

In operation S1630, the cache memory 720 may determine whether the at least one piece of map data received from the buffer memory device 1300 has the locality.

In an embodiment, the locality of the map data may mean map data corresponding to data which has a high possibility to be referenced again and may refer to any one of temporal locality, which is map data corresponding to pre-referenced data, and spatial locality, which is spatial adjacency to an address in which the pre-referenced data is stored. The host may have a tendency to sequentially read or write data. This is known as spatial locality of data. Furthermore, the host may have a tendency to access data that has been once accessed again within a relatively short time. This is known as a temporal locality of data.

In an embodiment, the cache memory 720 may determine whether the at least one piece of map data or target map data has the locality based on information about whether the target map data has the locality, the information being included in a signal received from a processor (e.g., the process 710 of FIG. 5). For example, when the processor 710 transmits the signal to the cache memory 720 according to an advanced extensible interface (AXI) protocol, the processor 710 may transmit the signal, which includes the information about whether the target map data has the locality in an available AXI user signal bit region through user definition, to the cache memory 720. The cache memory 720 may determine whether the target map data has the locality according to a bit indicating whether the target map data has the locality, the bit being included in the signal.

In an embodiment, the cache memory 720 may determine whether the target map data has the locality based on a bit indicating whether the target map data has the locality, the bit being included in the map data. The bit indicating whether the target map data has the locality may be included in the map data by the processor 710.

In operation S1640, when the target map data received from the buffer memory device 1300 has the locality, the cache memory 720 may cache the target map data.

In an embodiment, the cache memory 720 may replace at least one piece of map data among previously cached map data with currently received target map data and cache the target map data.

In an embodiment, the cache memory 720 may perform decoding on the target map data received from the buffer memory device 1300 and then cache the decoded target map data.

In operation S1650, when the target map data received from the buffer memory device 1300 does not have the locality, the cache memory 720 may not cache the target map data.

It will be apparent to those skilled in the art that various modifications can be made to the above-described embodiments of the present disclosure without departing from the spirit or scope of the invention.

What is claimed is:

1. A memory controller, comprising:
    a cache memory;
    a buffer memory device storing logical-physical address mapping information loaded from a nonvolatile memory device;
    a host control circuit configured to receive a read command and a logical address from a host, issue a first command, in response to the read command, to read out mapping information corresponding to the logical address, from the buffer memory device when the mapping information corresponding to the logical address is cache-missed in the cache memory, and cache the mapping information from the buffer memory device in the cache memory; and
    a flash translation layer configured to receive the logical address from the host control circuit, and issue a second command to read a physical address corresponding to the logical address from the mapping information cached in the cache memory.

2. The memory controller of claim 1, further comprising:
    a flash control circuit configured to read data corresponding to the read command from the nonvolatile memory device based on the physical address.

3. The memory controller of claim 1, further comprising an error correction circuit coupled between the buffer memory device and the cache memory,
    wherein the error correction circuit is configured to perform an ECC decoding operation on the mapping information output from the buffer memory device and to generate ECC decoded mapping information, and
    wherein the cache memory caches the ECC-decoded mapping information.

4. The memory controller of claim 2, wherein the buffer memory device is configured to buffer the data read from the nonvolatile memory device.

5. The memory controller of claim 2, wherein when the host control circuit receives a write command, a write logical address, and write data from the host, the flash translation layer maps a write physical address to the write logical address, and updates mapping information stored in the buffer memory device with the write physical address mapped to the write logical address, and the flash control circuit programs the write data in the nonvolatile memory device based on the write physical address.

6. The memory controller of claim 5, wherein the flash translation layer updates the mapping information stored in the buffer memory device by reading chunk data corresponding to the write logical address from the buffer memory device, modifying section data corresponding to the write physical address that is included in the chunk data, and writing modified chunk data including the modified section data to the buffer memory device.

7. A method of operating a memory system, the method comprising:
receiving, by a host control circuit, a read command and a logical address from a host;
searching a cache memory for mapping information corresponding to the logical address;
issuing a first command, in response to the read command, by the host control circuit when the mapping information corresponding to the logical address is cache-missed in the cache memory;
reading the mapping information corresponding to the logical address, from a buffer memory device storing logical-physical address mapping information loaded from a nonvolatile memory device;
caching the mapping information from the buffer memory device in the cache memory, in response to the first command, by the host control circuit;
transferring the logical address from the host control circuit to a flash translation layer;
issuing a second command, by the flash translation layer; and
reading, by the flash translation layer, a physical address corresponding to the logical address from the mapping information cached in the cache memory, in response to the second command.

8. The method of claim 7, wherein the caching comprises:
executing an ECC decoding operation on the mapping information to generate ECC decoded mapping information; and
caching the ECC-decoded mapping information in the cache memory.

9. The method of claim 7, further comprising:
receiving a write command, a write logical address, and write data from the host;
mapping a write physical address to the write logical address;
updating mapping information stored in the buffer memory device with the write physical address; and
programming the write data in the nonvolatile memory device based on the write physical address.

10. The method of claim 9, wherein updating the mapping information comprises:
reading chunk data corresponding to the write logical address from the buffer memory device;
modifying section data corresponding to the write physical address that is included in the chunk data; and
writing modified chunk data including the modified section data to the buffer memory device.

11. A memory system, comprising:
a nonvolatile memory device;
a buffer memory device configured to store logical-physical address mapping information loaded from the nonvolatile memory device; and
a memory controller configured to control operations of the nonvolatile memory device and the buffer memory device,
wherein the memory controller comprises:
a cache memory;
a host control circuit configured to receive a read command and a logical address from a host, issue a first command, in response to the read command, to read out mapping information corresponding to the logical address from the buffer memory device when the mapping information corresponding to the logical address is cache-missed in the cache memory, and cache the mapping information from the buffer memory device in the cache memory; and
a flash translation layer configured to receive the logical address from the host control circuit, and issue a second command to read a physical address corresponding to the logical address from the mapping information cached in the cache memory.

12. The memory system of claim 11, wherein the memory controller further comprises a flash control circuit configured to read data corresponding to the read command from the nonvolatile memory device based on the physical address.

13. The memory system of claim 11, wherein the memory controller further comprises an error correction circuit coupled between the buffer memory device and the cache memory,
wherein the error correction circuit is configured to perform an ECC decoding operation on the mapping information output from the buffer memory device and to generate ECC decoded mapping information, and
wherein the cache memory caches the ECC-decoded mapping information.

14. The memory system of claim 12, wherein the buffer memory device is configured to buffer the data read from the nonvolatile memory device.

15. The memory system of claim 12, wherein when the host control circuit receives a write command, a write logical address, and write data from the host, the flash translation layer maps a write physical address to the write logical address, and updates the logical-physical address mapping information stored in the buffer memory device with the write physical address mapped to the write logical address, and the flash control circuit programs the write data in the nonvolatile memory device based on the write physical address.

16. The memory system of claim 15, wherein the flash translation layer updates the logical-physical address mapping information stored in the buffer memory device by reading chunk data corresponding to the write logical address from the buffer memory device, modifying section data corresponding to the write physical address that is included in the chunk data, and writing modified chunk data including the modified section data to the buffer memory device.

* * * * *